United States Patent
Kijima et al.

(10) Patent No.: US 6,633,122 B2
(45) Date of Patent: *Oct. 14, 2003

(54) ELECTROLUMINESCENCE DEVICE WITH MULTIPLE LAMINATED BODIES HAVING COMMON MATERIALS AND PROCESS FOR PRODUCING THE SAME

(75) Inventors: Yasunori Kijima, Tokyo (JP); Shinichiro Tamura, Kanagawa (JP)

(73) Assignee: Sony Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/226,854

(22) Filed: Jan. 7, 1999

(65) Prior Publication Data

US 2002/0089282 A1 Jul. 11, 2002

(30) Foreign Application Priority Data

Jan. 9, 1998 (JP) ............................................. 10-002984
Jan. 9, 1998 (JP) ............................................. 10-002985

(51) Int. Cl.$^7$ ........................ H05B 33/00; H05B 33/14; H05B 33/22
(52) U.S. Cl. ...................... 313/506; 313/509; 313/504; 313/503; 445/24; 427/66; 428/690; 428/917
(58) Field of Search ................................. 313/498–512, 313/311; 428/690, 917; 445/24; 427/66

(56) References Cited

U.S. PATENT DOCUMENTS

| | | | |
|---|---|---|---|
| 5,393,614 A | * | 2/1995 | Nakada ....................... 313/504 |
| 5,681,756 A | | 10/1997 | Norman et al. ................. 437/1 |
| 5,693,428 A | | 12/1997 | Fujii et al. .................... 428/690 |
| 5,837,390 A | * | 11/1998 | Kishii et al. ................. 313/504 |
| 5,858,564 A | * | 1/1999 | Tamura et al. ............... 313/504 |
| 5,869,199 A | * | 2/1999 | Kido ........................... 313/504 |
| 5,903,101 A | * | 5/1999 | Kijima ........................ 313/506 |
| 5,949,188 A | * | 9/1999 | Leising et al. .............. 313/505 |
| 6,010,796 A | * | 1/2000 | Kijima ........................ 313/504 |

FOREIGN PATENT DOCUMENTS

EP 0 564 224 A2 10/1993

OTHER PUBLICATIONS

Chihaya Adachi, et al., "Confinement of Charge Carriers and Molecular Excitons Within 5–NM–Thick Emitter Layer in Organic Electroluminescent Devices With a Doouble Heterostructure", Applied Physics Letters. Aerican Institute of Physics, NY, vol. 57, No. 6, Aug. 6, 1990, pp. 531–533, XP000150169.

\* cited by examiner

Primary Examiner—Nimeshkumar D. Patel
Assistant Examiner—Mariceli Santiago
(74) Attorney, Agent, or Firm—Sonnenschein, Nath & Rosenthal

(57) ABSTRACT

An electroluminescence device has at least three kinds of laminated bodies, in each of which an emission region is independently present in each of a hole transfer layer and an electron transfer layer. The laminated bodies include the hole transfer layers, which each have a layer including a common material. The electron transfer layers each include a layer having a common material. The electroluminescence device emits at least three colors of light. A process for producing an electroluminescence device is also provided.

40 Claims, 25 Drawing Sheets

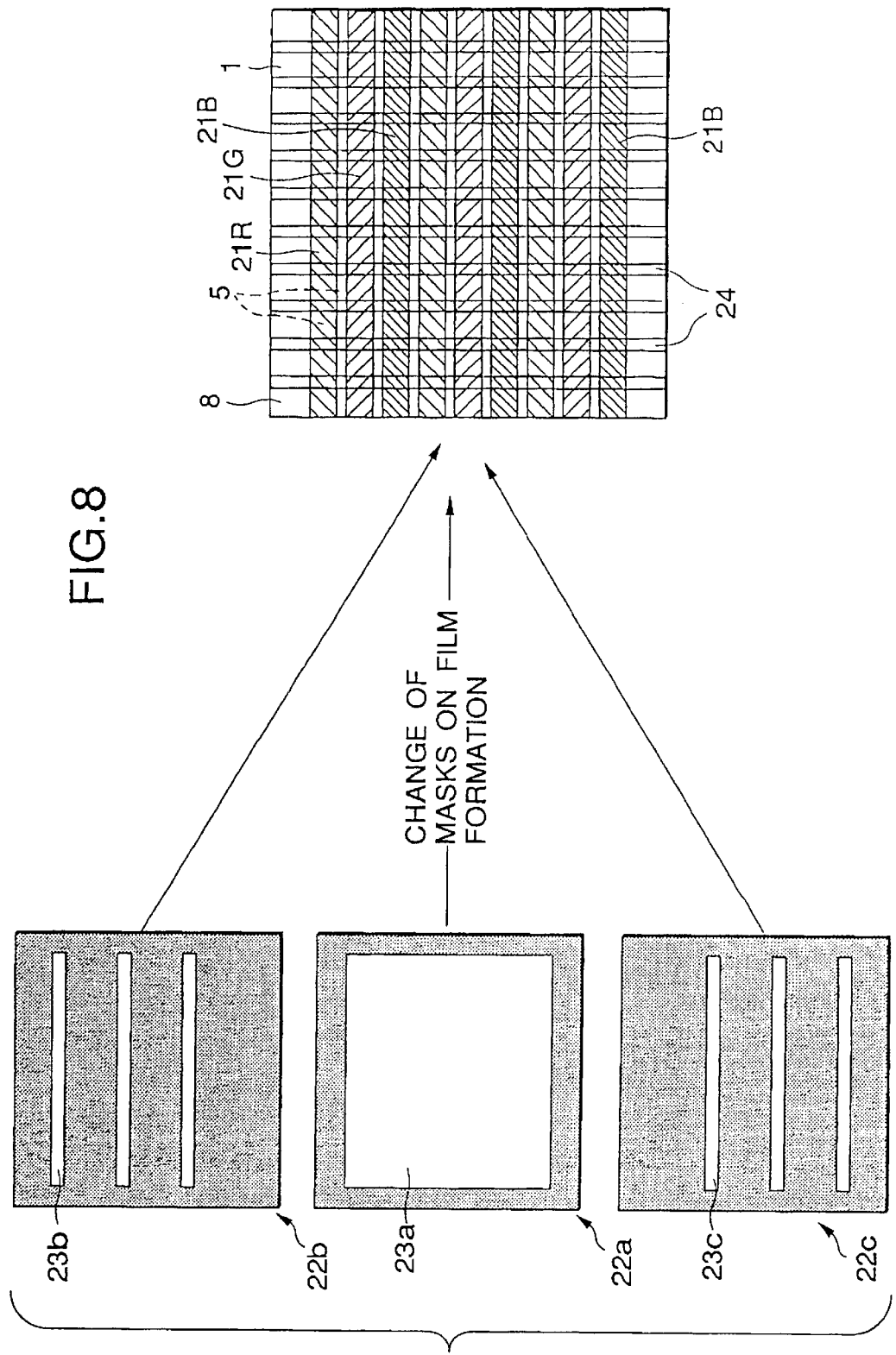

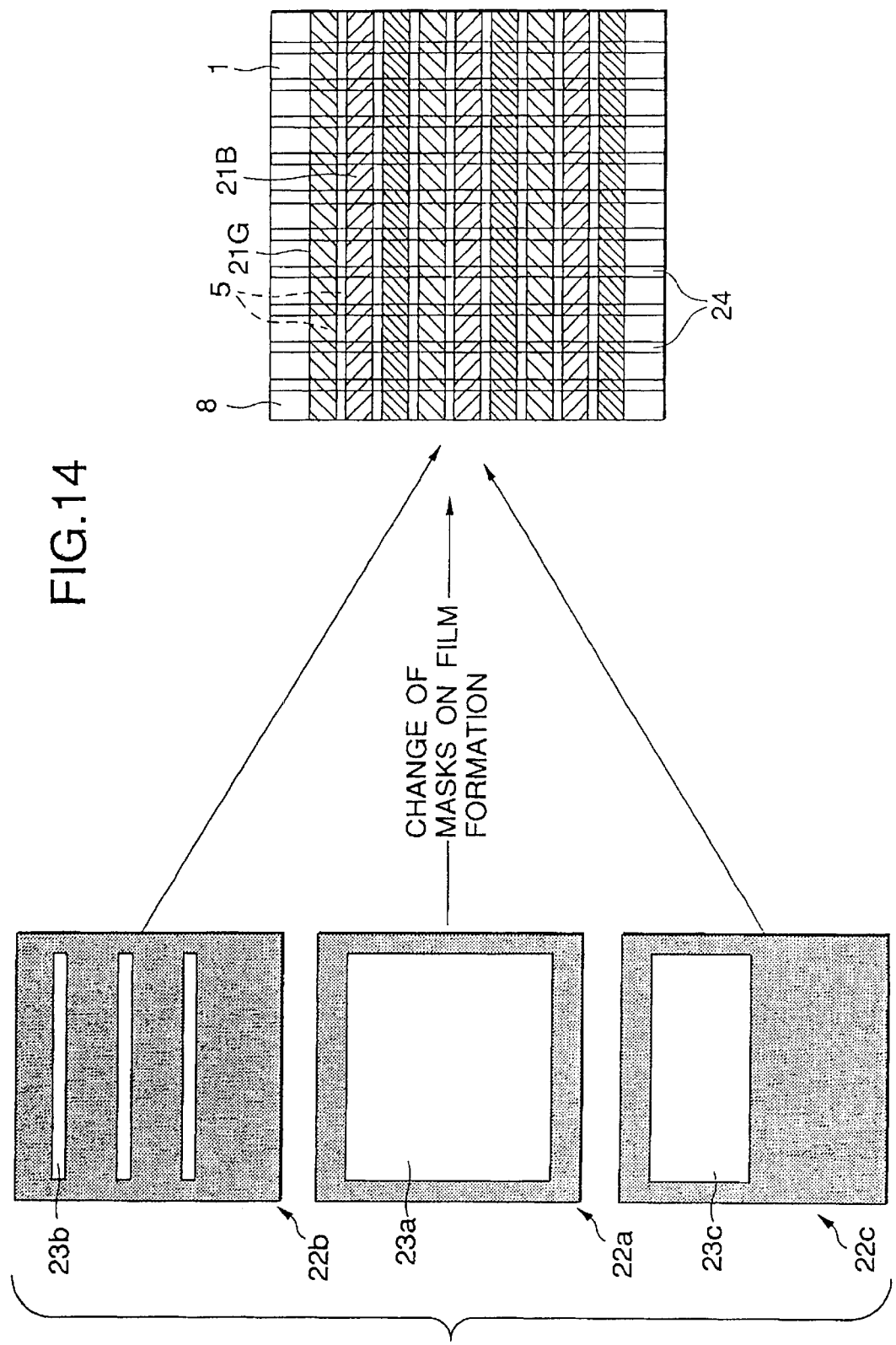

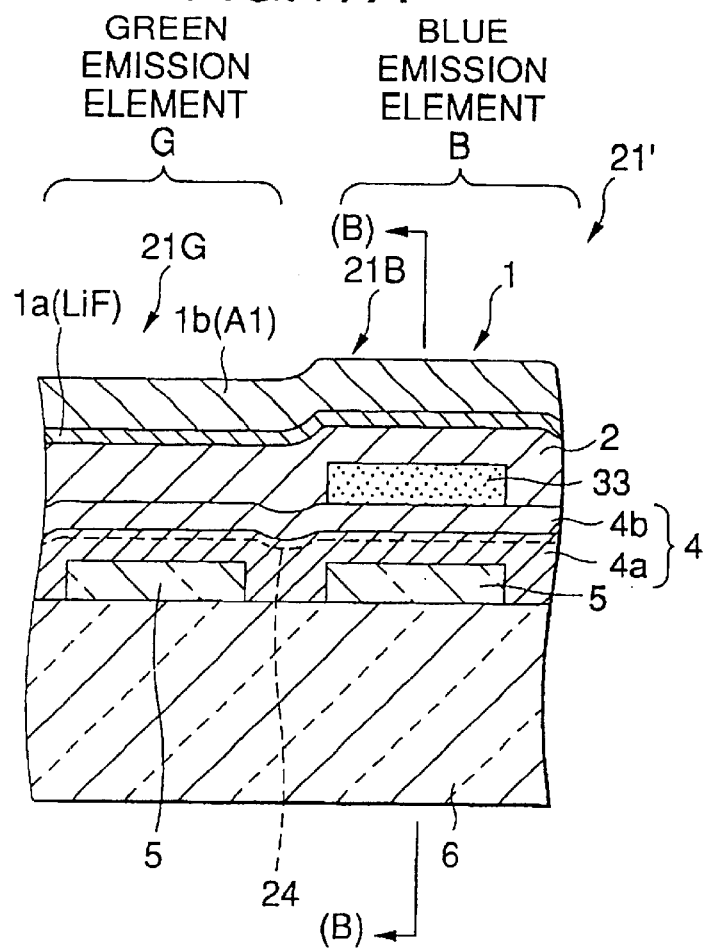
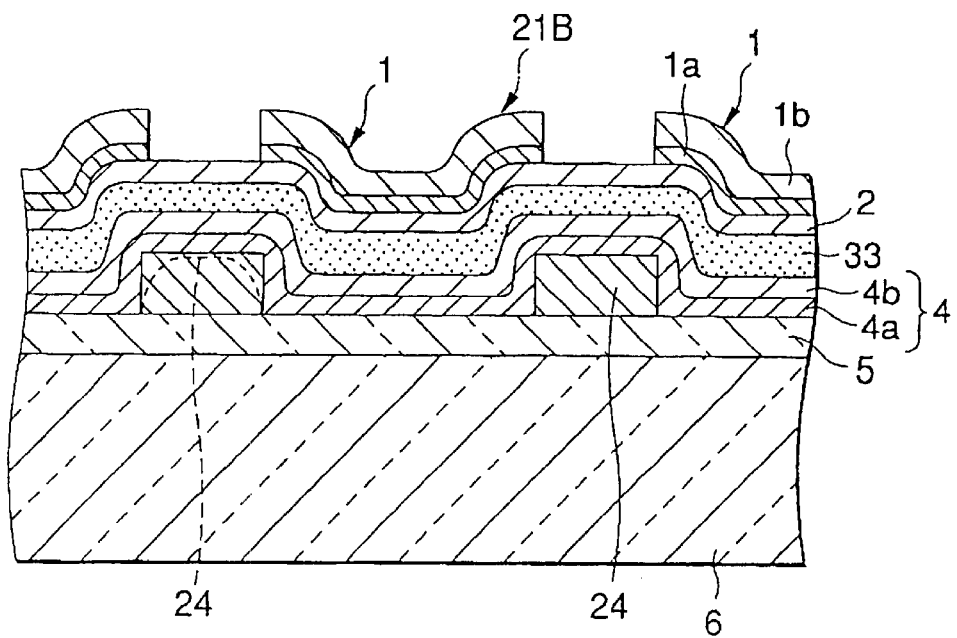

ELECTROLUMINESCENCE DEVICE WITH MULTIPLE LAMINATED BODIES HAVING COMMON MATERIALS AND PROCESS FOR PRODUCING THE SAME

BACKGROUND OF THE INVENTION

1. Field of the Invention

The present invention relates to an electroluminescence device and a process for producing the same, and for example, an electroluminescence device, which is a self-emission type flat display, which is particularly suitable for a display device or an emission device, such as an organic electroluminescence color display using an organic thin film as an electroluminescence layer, and a process for producing the same.

2. Description of the Related Art

The importance of an interface between a human being and a machine is recently being increased, such as in multimedia oriented commercial products. In order that a human being comfortably operates a machine with high efficiency, a sufficient amount of information must be withdrawn from the machine to be operated simply in a moment, and accordingly investigations of various display devices such as a display are being conducted.

It is the current situation in that a demand of miniaturization and thinning of a display device are being increased day by day along with miniaturization of the machine.

For example, there is notable progress in miniaturization of a lap-top type information processing apparatus, to which a display device is integrated, such as a note type personal computer and a note type word processor, and accordingly technical innovation in a liquid crystal display for its display device is also considerable.

A liquid crystal display is currently used as an interface of various products, and frequently used in products that are routinely used, such as a compact television set, a watch and a portable calculator, in addition to the lap-top type information processing apparatus.

Owing to the characteristic feature of a liquid crystal in that it can be driven with a low voltage and consumes low electric power, the liquid crystal display has been studied as the center of an interface between a human being and a machine for compact to large scaled display devices.

However, since the liquid crystal display is not of self-emission type, it requires a backlight, and a larger electric power is required to drive the backlight than to drive the liquid crystal. As a result, an operation time becomes short with a self-contained battery, which causes a limitation on use.

Furthermore, it is also a problem in that since the viewing angle of the liquid crystal display is narrow, it is not suitable as a large scaled display device, such as a large display.

It is also considered as a big problem in that since the display method of the liquid crystal display depends on the orientation state of liquid crystal molecules, the contrast changes depending on the angle even within the viewing angle.

From the standpoint of the driving method, an active matrix method, one of the driving methods, exhibits a response time sufficiently high as handling an animated image, but because it uses a TFT (thin film transistor) driving circuit, a large scaled display size is difficult to be obtained due to pixel fault.

In the liquid crystal display, a simple matrix method, another driving method, is low in cost and can rather easily produce a large display size, but it does not have a response time sufficiently high as handling an animated image.

On the other hand, as a self-emission type display device, a plasma display device, an inorganic electroluminescence device and an organic electroluminescence device are studied.

A plasma display device uses plasma emission in a low pressure gas for display, and is suitable for a large-scale or large capacity display, but involves a problem in thinning and cost. It also requires an alternative current bias of high voltage, and is not suitable for a portable apparatus.

While an inorganic electroluminescence device has been shipped as a commercial product, such as a green emission display, it is driven by alternative current bias as similar to the plasma display device, which requires a voltage of about several hundreds volt, and lacks practical utility.

However, with development in technology, it has been succeeded to emit the three primary colors, R (red), G (green) and B (blue), necessary for displaying a color image, but since it comprises an inorganic material, control of the emission wavelength by molecular designing is difficult, and it is considered that production of a full color display is difficult.

On the other hand, an electroluminescence phenomenon by an organic compound has been studied for a long time since the discovery of the emission phenomenon by carrier injection to an anthracene single crystal that generates strong fluorescence in the first half of 1960s. However, since it is of low luminance with a single color and requires a single crystal, it has been conducted as fundamental studies on carrier injection to an organic material.

However, since 1987 when Tang et al of Eastman Kodak reported an organic thin film electroluminescence device having a laminated structure having an amorphous emission layer that could be driven with a low voltage and could emit with high luminance, its studies and developments have been conducted in various field for emission of three primary colors, R, G and B, stability, increase in luminance, laminated structures, production processes, etc.

Various novel materials have been developed by a design of molecule, etc., which is a characteristic feature of an organic material, and application of an organic electroluminescence display device having superior characteristics, such as driving with low voltage direct current, a thin form and self-emission, is being studied for a color display.

An organic electroluminescence device (hereinafter sometimes called as an organic EL device) has a film thickness of 1 $\mu$m or less, and has ideal characteristics for a self-emission type display device, such as emission from an area with converting electric energy to light energy by injection of an electric current.

FIG. 1 shows an example of a conventional organic EL device 10. The organic EL device 10 is produced by film formation of an ITO (indium tin oxide) transparent electrode 5, a hole transfer layer 4, an emission layer 3, an electron transfer layer 2, and a cathode (for example, an aluminum electrode) 1 on a transparent substrate (for example, a glass substrate) 6 in this order by a vacuum evaporation method.

By applying an direct current voltage 7 between the transparent electrode 5, an anode, and the cathode 1, a hole as a carrier injected from the transparent electrode 5 migrates through the hole transfer layer 4, and an electron injected from the cathode 1 migrates through the electron transfer layer 2, and as a result, electron-hole recombination occurs to form emission 8 of a prescribed wavelength, which can be observed from the side of the transparent substrate 6.

An emission substance, such as anthracene, naphthalene, phenanthrene, pyrene, chrysene, perylene, butadiene, coumarin, acridine, stylbene, etc., may be used as the emission layer 3. This may be contained in the electron transfer layer 2.

FIG. 2 shows another conventional example, which is an organic EL device 20, in which the emission layer 3 is omitted, and the emission substance is contained in the electron transfer layer 2 as described above, so that the emission 18 of a prescribed wavelength is formed at the boundary between the electron transfer layer 2 and the hole transfer layer 4.

FIG. 3 shows a specific example of the above-described organic EL device. It is constituted in such a manner that a laminated body of the organic layers (the hole transfer layer 4, the emission layer 3 and the electron transfer layer 2) is provided between the cathode 1 and the anode 5; these electrodes are formed in the form of stripes that cross each other to form a matrix; a signal voltage is applied in time sequence by a brightness signal circuit 34 and a controller circuit 35 having a shift register, to form emission at each of the numerous points of intersection (pixels).

Therefore, by using such a constitution, it can be used as an image reproducing apparatus, in addition to a display. It can be constituted as for a full color or multi-color display by arranging the pattern of the stripes for each of the colors, R, G and B.

In the display device comprising plural pixels using such an organic EL device, the organic thin film layers 2, 3 and 4 are sandwiched by the transparent electrode 5 and the metallic electrode 1, and emit light to the side of the transparent electrode 5.

However, the organic EL device still has problems unsolved.

Stable emission of the three primary colors, R, G and B is the necessary condition of the application of the organic EL device to a color display. When different series of material are used in these three systems of R, G and B in the process for producing the device, the production steps become extremely complicated and a long period of time is required.

SUMMARY OF THE INVENTION

An object of the invention is to provide an electroluminescence device that can be easily produced with a low cost and has a device structure capable of conducting stable emission, and a process for producing the same.

The inventors have conducted earnest investigations for the above-described circumstances, and have found that the device can be easily produced with a low cost by using the common material as possible in at least three kinds of laminated bodies having emission regions for the respective colors, so as to attain the invention.

Accordingly, a first aspect of the invention relates to an electroluminescence device comprising at least three kinds of laminated bodies, in each of which an emission region is independently present in each of a hole transfer layer and an electron transfer layer, the laminated bodies comprising the hole transfer layers each comprising a layer comprising a common material, and the electron transfer layers each comprising a layer comprising a common material, and the electroluminescence device emitting at least three colors of light.

A second aspect of the invention relates to an electroluminescence device comprising two kinds of laminated bodies, in each of which an emission region is independently present in each of a hole transfer layer and an electron transfer layer, the laminated bodies comprising the hole transfer layers each comprising a layer comprising a common material, and the electron transfer layers each comprising a layer comprising a common material, and the electroluminescence device emitting two colors of light.

According to the electroluminescence device of the invention, because the hole transfer layers and the electron transfer layers each comprise the common material layer within each of the laminated bodies, in which the emission region is independently present in each of the hole transfer layer and the electron transfer layer, the laminated bodies for each of the colors of emission light can be easily produced with a low cost. By forming the common layers on the whole surface of an effective pixel region by using a mask with a large opening, the film formation property and the step coverage property become good, and a leakage current between the cathode and the anode can be reduced.

The invention also provides a process for producing an electroluminescence device, as a process for producing the electroluminescence device of the first aspect of the invention with good reproducibility, which comprises a step of forming a first electrode, which is common in at least three kinds of the laminated bodies, on a common substrate, a step of forming the hole transfer layers by film formation of a common hole transfer layer forming material on a region containing at least three kinds of the laminated bodies on the first electrode, a step of forming the electron transfer layers by film formation of a common electron transfer layer forming material on a region containing at least three kinds of the laminated bodies on a region containing the hole transfer layers, and a step of forming second electrodes for at least three kinds of the laminated bodies on the electron transfer layers, to face the first electrode.

The invention also provides a process for producing an electroluminescence device, as a process for producing the electroluminescence device of the second aspect of the invention with good reproducibility, which comprises a step of forming a first electrode, which is common in two kinds of the laminated bodies, on a common substrate, a step of forming the hole transfer layers by film formation of a common hole transfer layer forming material on a region containing two kinds of the laminated bodies on the first electrode, a step of forming the electron transfer layers by film formation of a common electron transfer layer forming material on a region containing two kinds of the laminated bodies on a region containing the hole transfer layers, and a step of forming second electrodes for two kinds of the laminated bodies on the electron transfer layers, to face the first electrode.

BRIEF DESCRIPTION OF THE DRAWINGS

FIGS. 4A to 4C are schematic cross sectional views of the organic EL device in a first embodiment according to the first aspect of the invention, in which FIG. 4A is the blue emission element; FIG. 4B is the green emission element; and FIG. 4C is the red emission element;

FIG. 8 is a schematic plan view of the vapor deposition masks used in the embodiment as shown in FIG. 5, and the organic EL device produced;

FIGS. 13A and 13B are schematic cross sectional views of the organic EL device in a fourth embodiment according to the second aspect of the invention, in which FIG. 13A is the blue emission element; and FIG. 13B is the green emission element;

FIG. 14 is a schematic plan view of the vapor deposition masks used in the embodiment as shown in FIGS. 13A and 13B, and the organic EL device produced;

FIG. 17A is a cross sectional view perpendicular to the anode of an important part of the organic EL device according to another example of the invention; and FIG. 17B is a cross sectional view along the anode taken along (B)—(B) line of FIG. 17A;

DETAILED DESCRIPTION OF THE PREFERRED EMBODIMENTS

Figure 1:
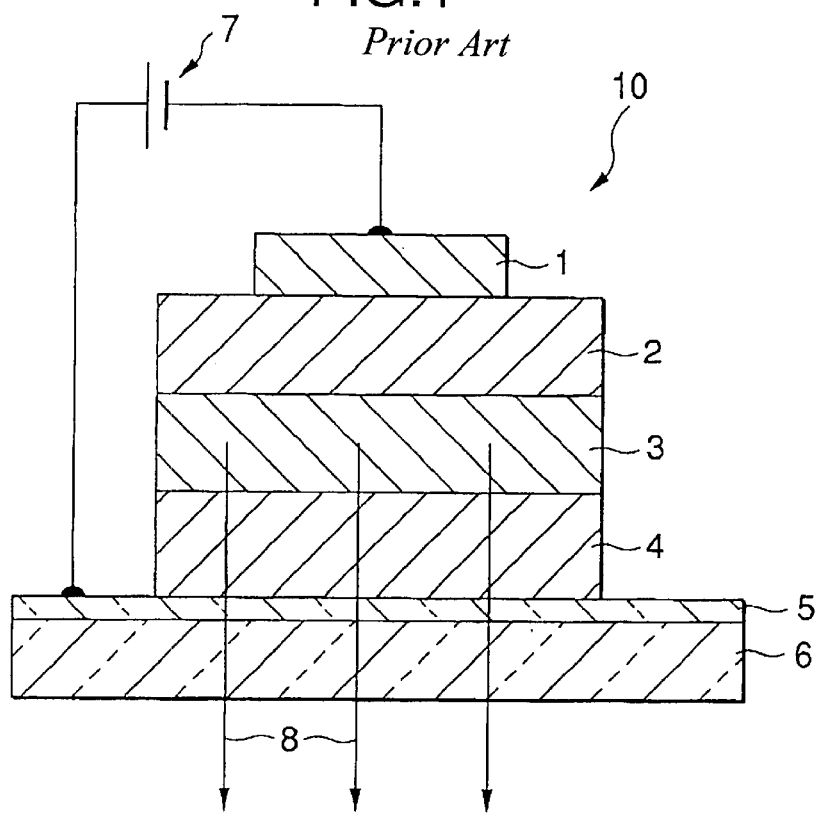
FIG. 1 is a schematic cross sectional view showing an example of the conventional organic EL device.
Figure 2:
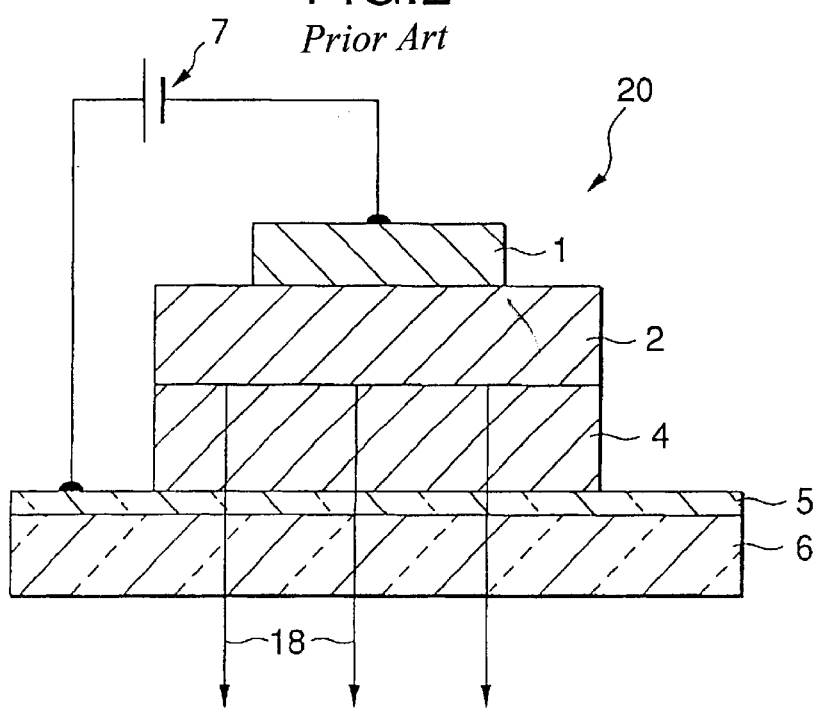
FIG. 2 is a schematic cross sectional view showing another example of the conventional organic EL device.
Figure 3:
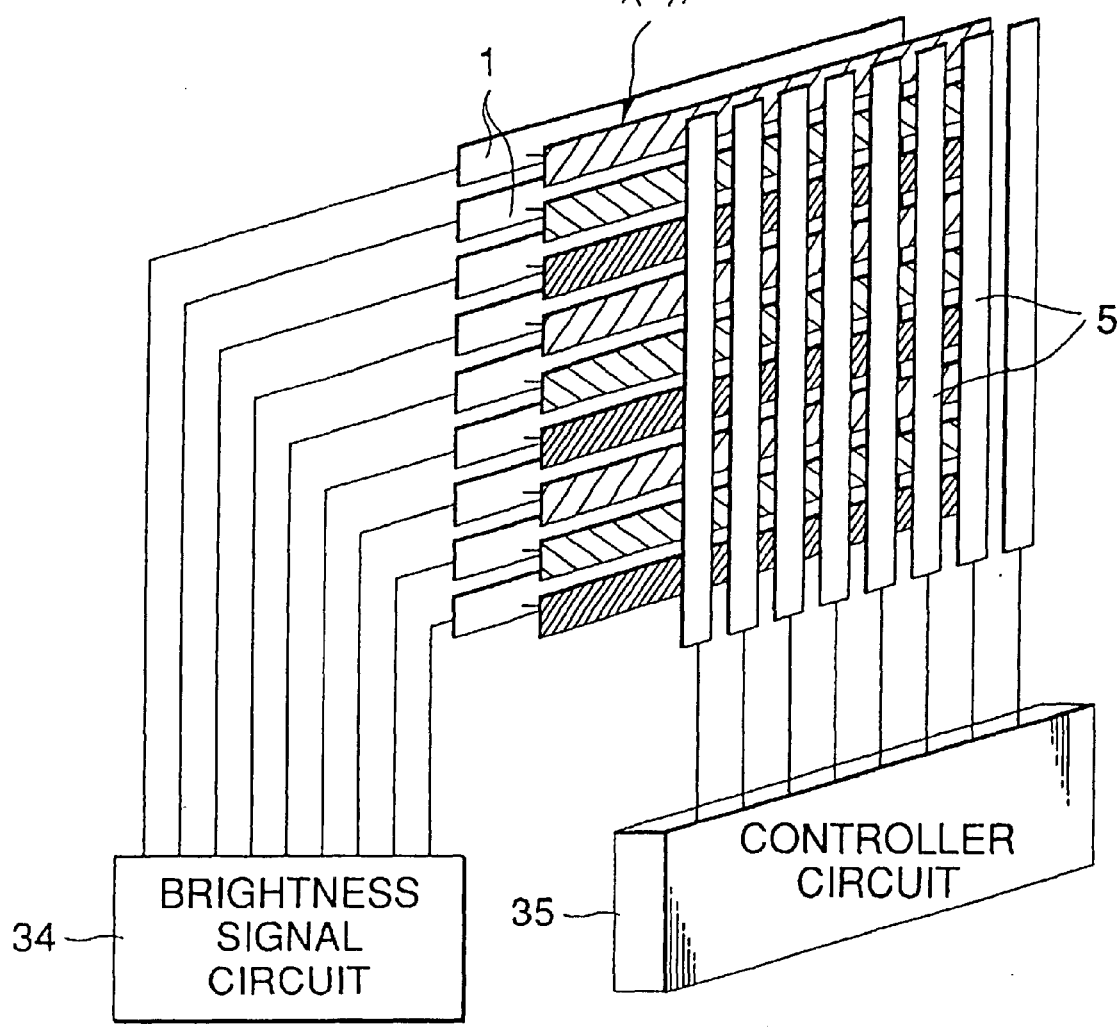
FIG. 3 is a schematic perspective view showing a specific example of the conventional organic EL device.

In the electroluminescence device and its production process of the first aspect of the invention, it is preferred that the emission region comprises an organic compound, it comprises at least three kinds of the laminated bodies each comprising an organic substance containing the emission region, in at least one of the laminated bodies, blue emission is obtained by recombination of an electron and a hole in a hole transfer organic material.

According to such an electroluminescence device, emission can be obtained by the recombination of an electron and a hole in the hole transfer organic material (that is, the hole transfer layer has a structure also serving as an emission layer, i.e., the recombination region of an electron and a hole), and thus stable and high luminance emission, particularly blue emission, becomes possible with low voltage driving.

Therefore, in the electroluminescence device that has a structure difficult to be realized due to the absence of a non-emission excellent electron transfer material (particularly, a thin amorphous organic electroluminescence device of low voltage driven and self-emission), the hole transfer layer also serves as an emission layer, and a long-life electroluminescence device having a device structure that can provide stable emission for a long period of time.

Accordingly, in the organic electroluminescence device having a hole transfer layer serves as an emission layer, stable emission with high luminance and high efficiency can be obtained. This is conspicuous in blue emission, and a luminance of 10,000 cd/m$^2$ or more can be obtained by DC driven, or a peak luminance of 55,000 cd/m$^2$ in terms of direct current conversion can be obtained by pulse driven at a duty factor of 1/100.

In addition to the blue emission device, green emission, as well as red emission and yellow emission by further doping are possible, and adjustment of chromaticity can be conducted by doping. Accordingly, an organic electroluminescence blue emission device that can emit blue light of excellent chromaticity with high luminance can be produced, and possibility and reduction in time on development of materials, and design concept in novel emission materials and electron transfer materials can be indicated.

In the electroluminescence device and its production process of the first aspect of the invention, the emission region is mainly the organic hole transfer layer, and it preferably has a hole block layer for causing the recombination in the hole transfer layer.

The hole block layer is preferably provided between the hole transfer layer and the electron transfer layer.

It is preferred that the highest occupied molecular orbital level of the hole block layer is lower than the lower one in energy of the highest occupied molecular orbital levels of the organic layers (particularly, the hole transfer layer and the electron transfer layer) laminated in contact with both sides of the hole block layer.

It is also preferred that the lowest unoccupied molecular orbital level of the hole block layer is higher than the lower one in energy of the lowest unoccupied molecular orbital levels of the organic layers (particularly, the hole transfer layer and the electron transfer layer) laminated in contact with both sides of the hole block layer, and is lower than the higher one in energy of them.

The hole block layer preferably comprises a non-emission material of a low fluorescence yield, and may have a laminated structure comprising plural layers.

Furthermore, while the hole block layer is not limited in material, it preferably comprises a non-emission material of a low fluorescence yield to prevent the formation of an exciplex (dimer) at the boundary to the hole transfer emission layer (i.e., reduction in emission efficiency).

The emission region preferably comprises a hole transfer material for emission of short wavelength light. As the material that can be used in the hole block layer, a phenanthroline derivative of the following formula (1) is preferred:

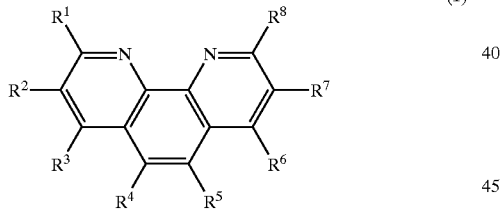

(1)

(wherein $R^1$ to $R^8$ each represents a hydrogen atom, a substituted or unsubstituted alkyl group, a substituted or unsubstituted aryl group, a substitued or unsubstitued amino group, a halogen atom, a nitro group, a cyano group or a hydroxyl group). Specific examples includes, for example, materials of the structural formulas (2) to (11).

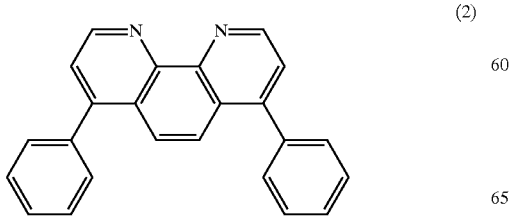

(2)

-continued

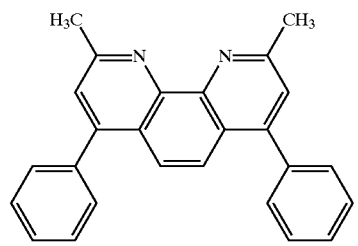

(3)

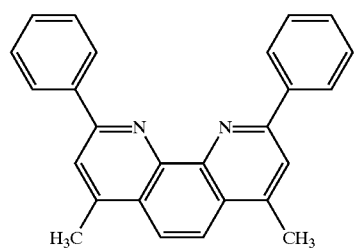

(4)

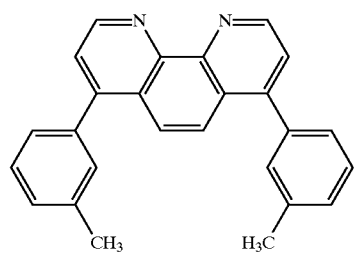

(5)

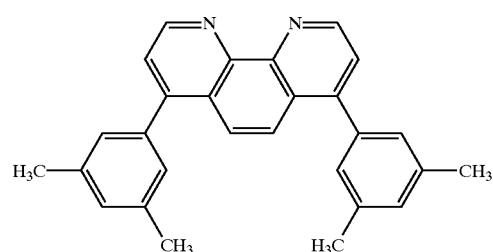

(6)

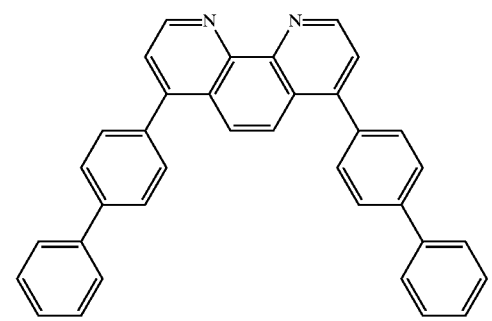

(7)

-continued

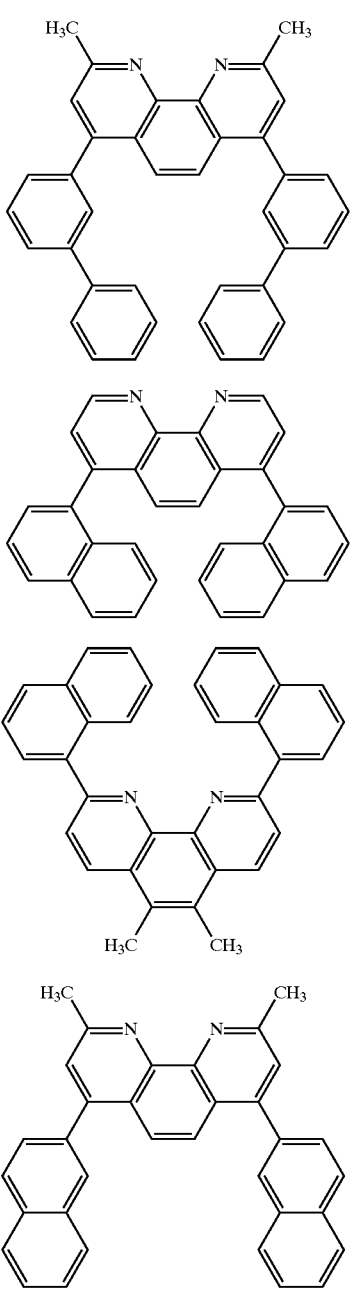

(8)
(9)
(10)
(11)

Furthermore, it is preferred that the emission region comprises an organic compound, it comprises at least three kinds of the laminated bodies each comprising an organic substance containing the emission region, and in at least one of the laminated bodies, green emission is obtained by recombination of an electron and a hole in an electron transfer organic material.

It is also preferred that the emission region comprises an organic compound, it comprises at least three kinds of the laminated bodies each comprising an organic substance containing the emission region, and in at least one of the laminated bodies, red emission is obtained by recombination of an electron and a hole in an electron transfer organic material.

By laminating the organic layer for obtaining blue emission by the recombination of an electron and a hole in the emission region as the hole block layer, an organic electroluminescence device having a hole transfer emission layer that can stably exhibit high luminance with low voltage driven can be obtained, and at the same time, an excellent organic electroluminescence device that can serve at least R, G and B can be provided, in which red or green emission by the recombination of an electron and a hole in the electron transfer layer can be obtained in the laminated region of the organic material in the absence of the hole block layer.

In the second aspect of the invention, by laminating the organic layer for obtaining blue emission by the recombination of an electron and a hole in the emission region as the hole block layer, an organic electroluminescence device having a hole transfer emission layer that can stably exhibit high luminance with low voltage driven can be obtained, and at the same time, an excellent organic electroluminescence device that can serve G and B can be provided, in which green emission by the recombination of an electron and a hole in the electron transfer layer can be obtained in the laminated region of the organic material in the absence of the hole block layer.

In the above-described device, it is preferred that a transparent electrode, an organic layer (particularly, the organic hole transfer layer, the hole block layer and the organic electron transfer layer), and a metallic electrode are laminated in this order on an optically transparent substrate.

In this case, it is preferred that the device comprises an organic electroluminescence device, in which the transparent electrode, the organic layer and the metallic electrode form a matrix pattern on the same substrate.

Accordingly, the above-described device becomes a preferred organic electroluminescence emission device and becomes suitable for a device for a color display.

Preferred embodiments of the invention are explained below.

First Embodiment

Figure 4A:
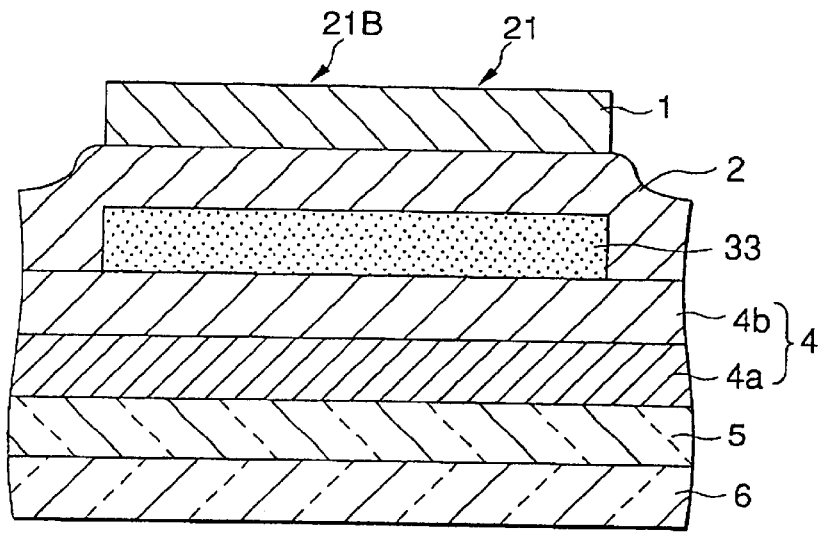
Figure 4B:
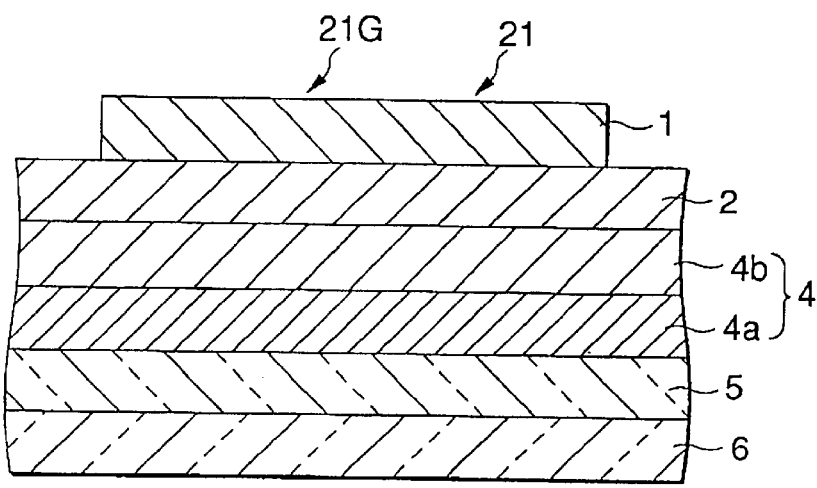
Figure 4C:
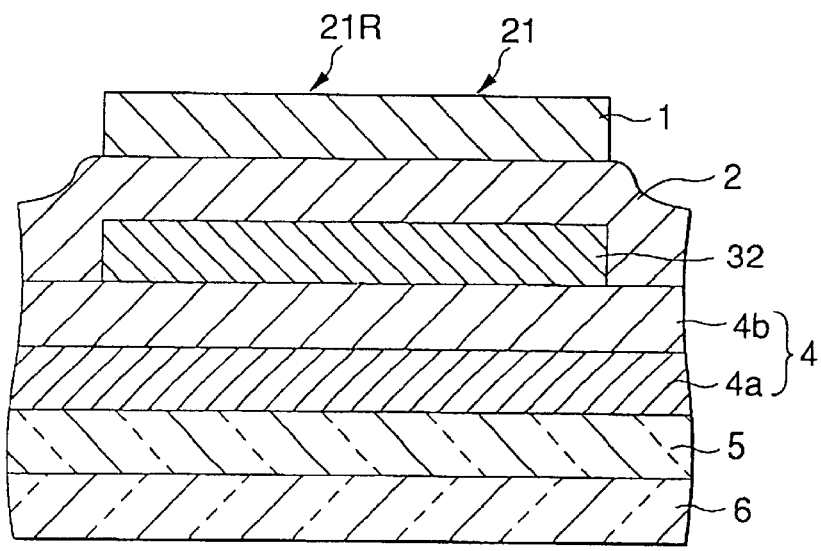

FIGS. 4A to 4C are schematic cross sectional views showing an important part of an organic EL device 21 in a first embodiment according to the first aspect of the invention.

The organic EL device 21 of this embodiment comprises an organic electroluminescence elements 21B (blue), 21G (green) and 21R (red) each comprising a laminated body of amorphous organic thin films for emission of at least three kinds of light on a common glass substrate 6.

In the blue emission element 21B shown in FIG. 4A, a transparent electrode 5 comprising an indium oxide, etc. (hereinafter the same) doped with ITO (indium tin oxide) or Zn is formed on the glass substrate 6 as a row or line electrode by a method such as sputtering or vacuum evaporation, and a hole transfer emission layer 4a for blue emission, a hole transfer emission layer 4b, a hole block layer 33, an electron transfer layer (or an electron transfer emission layer) 2, and a cathode 1 as a column electrode are laminated thereon in this order by a vacuum evaporation method.

In the green emission element 21G shown in FIG. 4B, the transparent electrode 5 comprising ITO, etc. is formed on the glass substrate 6 by a method such as sputtering or vacuum evaporation, and the hole transfer emission layers 4a and 4b, an electron transfer layer 2 for green emission, and the cathode 1 as a column electrode are laminated thereon in this order by a vacuum evaporation method, with the hole block layer being not provided.

In the red emission element 21R shown in FIG. 4C, the transparent electrode 5 comprising ITO, etc. is formed on the glass substrate 6 by a method such as sputtering or vacuum evaporation, and the hole transfer emission layers 4a and 4b, an electron transfer layer 32 for red emission, the electron transfer layer 2, and the cathode 1 as a column electrode are laminated thereon in this order by a vacuum evaporation method.

The characteristic feature of the organic EL device 21 of FIGS. 4A to 4C resides in that the transparent electrode 5 is formed as a row electrode or a line electrode, which is common in at least three kinds of the emission elements 21B, 21G and 21R, on the glass substrate 6, which is common in the emission elements; on the transparent electrode, the hole transfer layers 4a and 4b formed from the hole transfer layer forming material, which are common to each other, are formed on a region containing the emission elements, are formed; the electron transfer layers 2 formed from the electron transfer layer forming material, which is common to each other, is formed on a region containing the emission elements, are formed on the region containing the hole transfer layers; and on the electron transfer layers, the cathodes 1 are formed for the respective emission elements in the form of a matrix pattern facing the transparent electrode 5. The emission elements each have a unique layer constitution, and the blue emission element 21B and the red emission element 21R have the hole block layer 33 and the red emission layer 32, respectively, in the form of a stripe pattern.

Therefore, in each of the emission elements, because the emission region comprises the hole transfer layers 4 (4a and 4b) and the electron transfer layers 2 comprising the common material, a laminated body (matrix) in the form of stripes exhibiting emission of each colors of light can be easily produced with a low cost. Furthermore, on the whole surface of an effective pixel region, by forming the common layers by using a mask with a large opening, the film formation property and the step coverage property become well, and a leakage current between the cathode and the anode can be reduced.

The blue emission element 21B is constituted as a structure having the hole transfer layer 4 that also serves as an emission layer, and its basic structure is the same as in other embodiments described later.

The characteristic feature of the element 21B in this embodiment resides in that because the hole block layer 33 is laminated as being inserted between the hole transfer layer 4 and the electron transfer layer 2, the recombination of an electron and a hole in the hole transfer layer 4 is accelerated, and emission in the hole transfer layer 4 is obtained.

Figure 5:
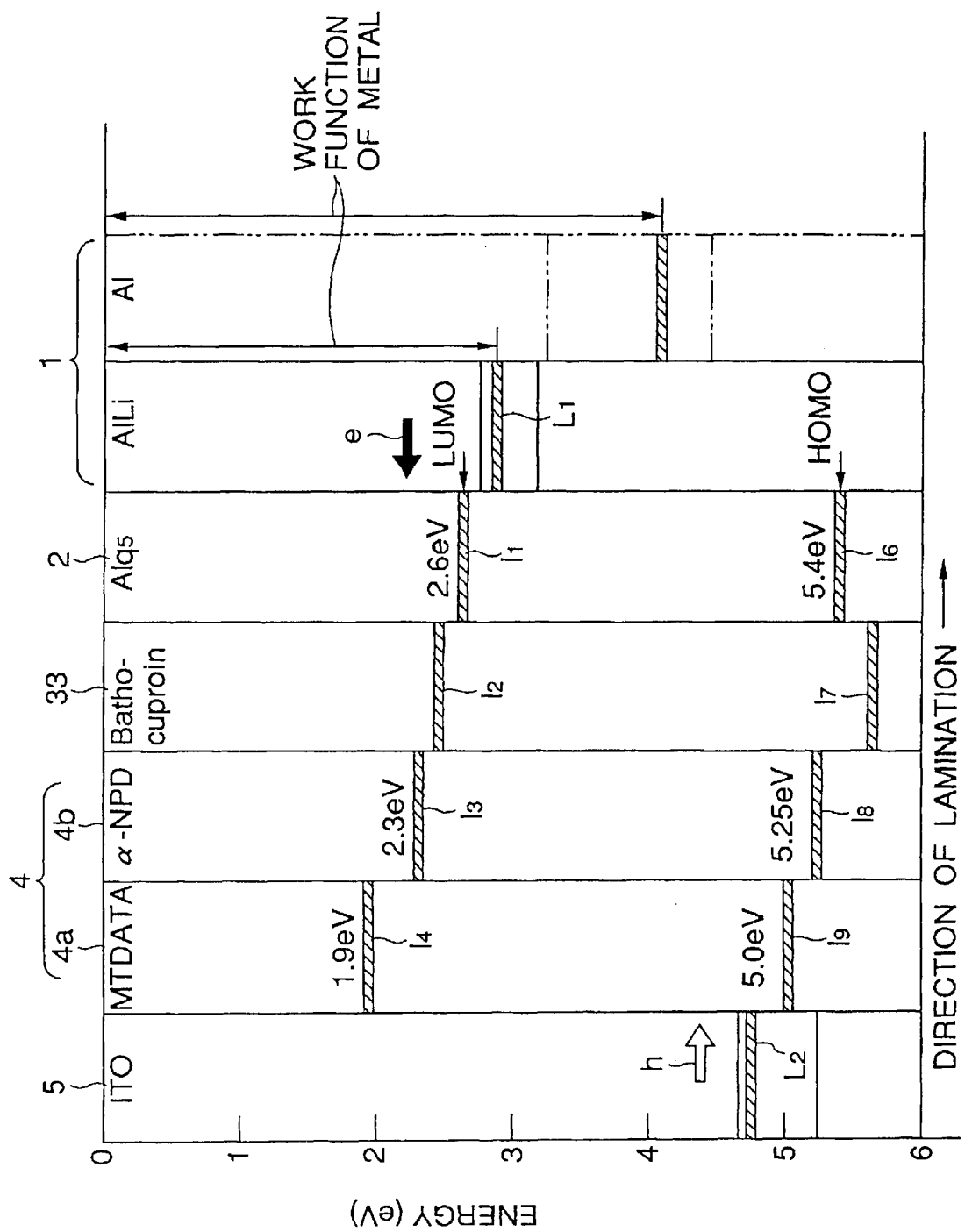
FIG. 5 is a band model diagram schematically showing the laminated structure of the organic EL device according to the embodiment as shown in FIG. 4A.

FIG. 5 is a schematic view showing the laminated structure of this embodiment (FIG. 4A) described above as a band model.

In FIG. 5, the thick lines ($L_1$ and $L_2$) shown in the layers of the cathode 1 comprising Al and Al—Li (aluminum-lithium) and the ITO transparent electrode 5 are approximate work functions of the metals of them; and in the layers between the both electrodes, the thick lines on the upper side $l_1, l_2, l_3$ and $l_4$ and the numerals show the levels of the lowest unoccupied molecular orbital (LUMO) of them, and the thick lines on the lower side $l_5, l_6, l_7$ and $l_8$ and the numerals show the levels of the highest occupied molecular orbital (HOMO) of them. The energy level values in FIG. 5 are only an example and vary depending on the materials.

In this organic EL device, as shown in FIG. 5, a hole h injected from the transparent electrode 5 as an anode migrates through the hole transfer layer 4, and an electron e injected from the metallic electrode 1 as a cathode migrates through the electron transfer layer 2, and as a result, the electron-hole recombination occurs in the hole transfer layer 4 to form emission.

Since the electron e injected from the metallic electrode 1 as a cathode has a nature of migrating toward the direction of lower energy level, it can reach the hole transfer emission layers 4a and 4b through the lowest unoccupied molecular orbital (LUMO) levels $l_1, l_2, l_3$ and $l_4$ of the metallic electrode 1, the electron transfer layer 2, the hole block layer 33, the hole transfer emission layer 4b and the hole transfer emission layer 4a in this order.

On the other hand, since the hole h injected from the ITO transparent electrode 5 as an anode has a nature of migrating toward the direction of higher energy level, it can migrate to the electron transfer layer 2 through the highest occupied molecular orbital (HOMO) levels $l_5, l_6$, and $l_7$ of the hole transfer emission layers 4a and 4b and the hole block layer 33 in this order.

As shown in FIG. 5, however, because the highest occupied molecular orbital (HOMO) level 18 of the electron transfer layer 2 is lower than the highest occupied molecular orbital (HOMO) level $l_7$ of the hole block layer 33, the hole h thus injected is difficult to migrate from the hole block layer 33 to the electron transfer layer 2, and is filled in the hole block layer 33.

As a result, the hole h filled in the hole block layer 33 accelerates the electron-hole recombination in the hole transfer layer 4, and emission is conducted by the emission materials of the hole transfer emission layers 4a and 4b constituting the hole transfer layer 4.

Figure 6:
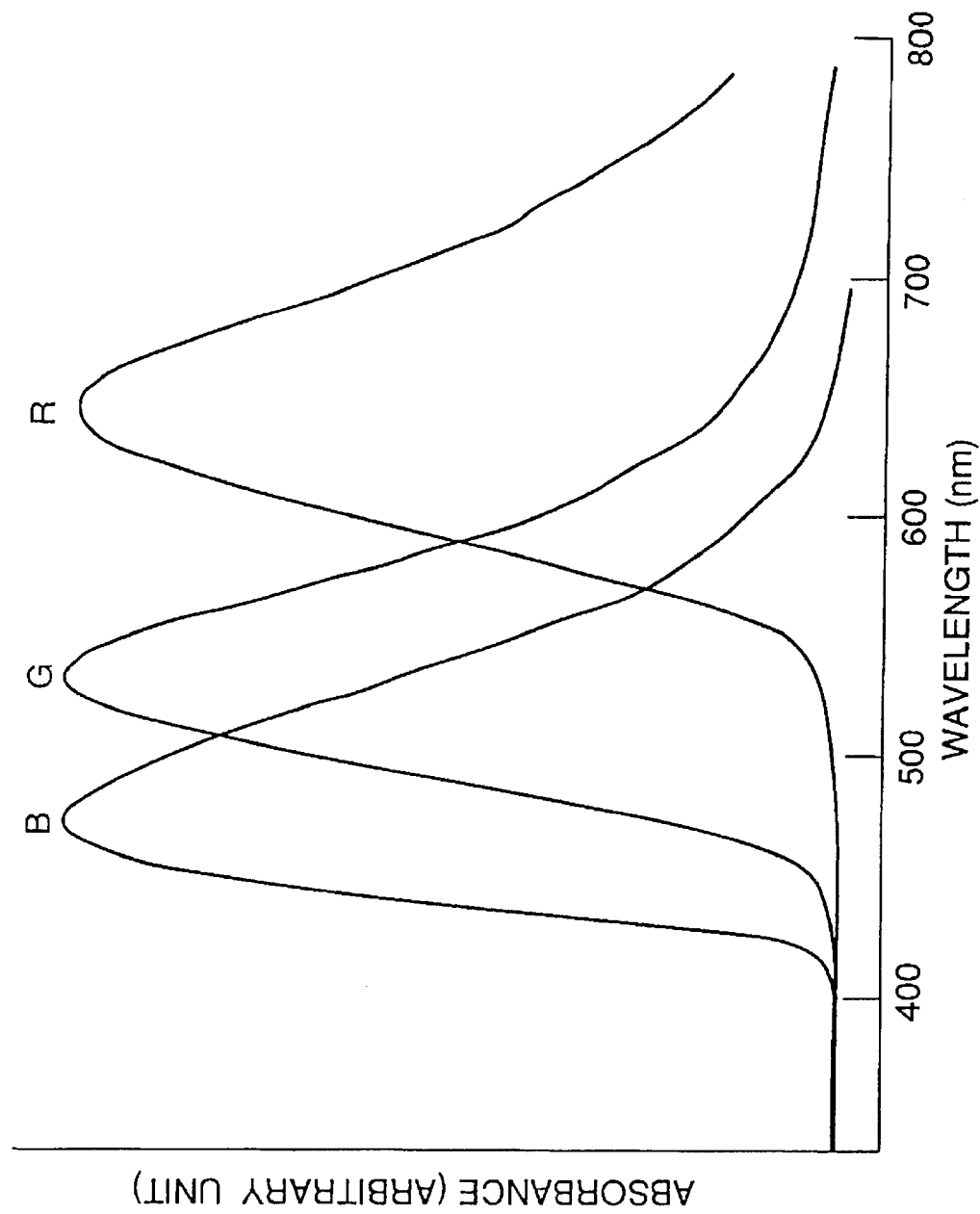
FIG. 6 is a graph showing the spectroscopic characteristics of the organic EL device according to Example 1 of the invention.

Accordingly, by providing the hole block layer 33, the transfer of the hole h is effectively controlled by the hole block layer 33 to effectively occur the electron-hole recombination in the hole transfer layer 4. Among the hole transfer emission layers 4a and 4b thus emitting, the emission of the hole transfer remission layer 4b adjacent to the hole block layer 33 is assisted by the emission of the hole transfer emission layer 4a, and light having a certain wavelength (blue color) is emitted as shown in FIG. 6.

The electron-hole recombination inherently occurs in each of the electron transfer layer 2 and the hole transfer layer 4 by the injection of an electron from the cathode 1 and the injection of a hole from the anode 5. Therefore, in the case where the hole block layer 33 described above is not present, the recombination of an electron and a hole occurs at the boundary of the electron transfer layer 2 and the hole transfer layer 4, and only light of a long wavelength can be obtained. However, by providing the hole block layer 33 as described above, blue emission can be accelerated with the hole transfer layer 4 containing an emission substance as the emission region.

The hole block layer 33 is to control the transfer of a hole h as described above. In order to realize such control, it is only required that the highest occupied molecular orbital (HOMO) of the hole block layer 33 is lower than the lower level of the highest occupied molecular orbital (HOMO) in energy of the highest occupied molecular orbital (HOMO) levels of the hole transfer emission layer 4b and the electron transfer layer 2; and the lowest unoccupied molecular orbital (LUMO) of the hole block layer 33 is higher than the lower one of the lowest unoccupied molecular orbital (LUMO) in energy of the lowest unoccupied molecular orbital (LUMO) levels of the hole transfer emission layer 4b and the electron transfer layer 2, and is lower than the higher level of the lowest unoccupied molecular orbital (LUMO) in energy of them, and thus it is not limited to the above-described constitution.

The hole block layer 33 may be formed from various materials, and its thickness may vary within the range where its function can be maintained. While the thickness is preferably from 1 Å to 1,000 Å (from 0.1 nm to 100 nm), if it is too thin, the function of hole blocking tends to be incomplete, and the recombination region is liable to bridge the hole transfer layer and the electron transfer layer, and if it is too thick, emission may not be conducted due to increase in a film resistance.

In the green emission element 21G, since the hole block layer 33 is not provided, a hole migrates into the electron transfer layer 2 to cause the electron-hole recombination in the electron transfer layer 2, and emission is conducted by the electron transfer layer 2 to emit light having a certain wavelength (green color) as shown in FIG. 6.

In the red emission element 21R, since the red emission layer 32 is provided instead of the hole block layer 33, a hole migrates into the emission layer 32 to cause the electron-hole recombination in the emission layer 32, and emission is conducted by the emission layer 32 to emit light having a certain wavelength (red color) as shown in FIG. 6.

Figure 7:
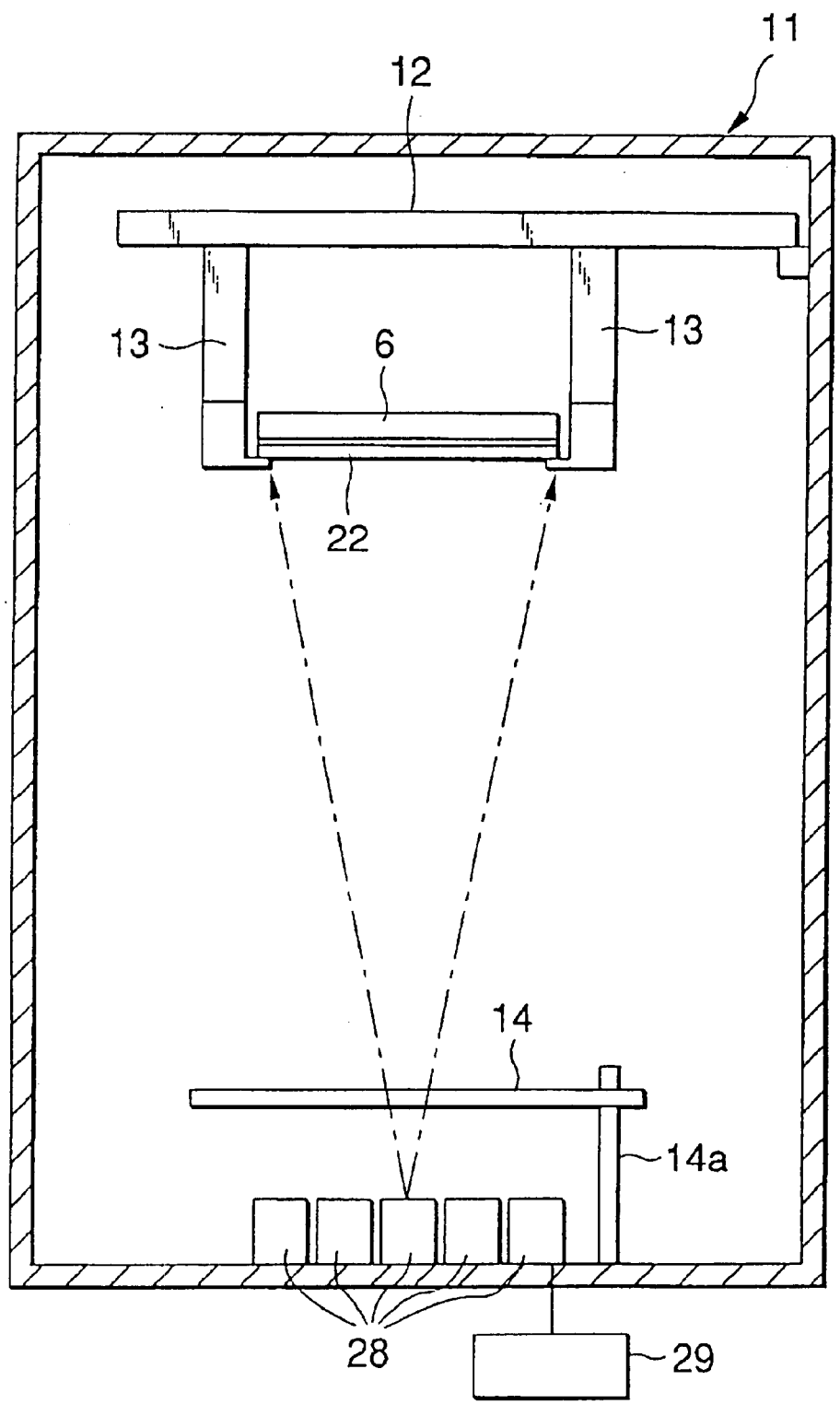
FIG. 7 is a schematic cross sectional view of the vapor deposition apparatus used in the embodiment as shown in FIG. 5.

The organic EL device 21 is produced by using a vapor deposition apparatus 11 shown in FIG. 7. The apparatus has in its inside a pair of holding means 13 fixed under an arm 12, and a stage structure (omitted from the figure) capable of setting a transparent glass substrate 6 facing downward and a mask 22 is provided between a pair of the fixing means 13. A shutter 14 supported by a bearing shaft 14a is provided under the glass substrate 6 and the mask 22, various vapor deposition sources 28 are provided thereunder. The vapor deposition sources are heated by a resistance heating method by a power source 29. The heating is also conducted by an EB (electron beam) heating method depending on necessity.

In the apparatus described above, the mask 22 is for the pixels, and the shutter 14 is for the vapor deposition materials. The shutter 14 rotates with the bearing shaft 14a as the center, and cuts off a vapor stream of the vapor deposition material depending on the sublimation temperature of the material.

As the mask 22, three kinds of them shown in FIG. 8 are actually used, and various types of formation are conducted to form a prescribed pattern with suitably interchanging them. The hole transfer layer 4 is formed by using a mask 22a through a large opening 23a as common to the elements; the hole block layer 33 is formed by using a mask 22b through a opening 23b in the form of slits to have a prescribed pattern for the blue emission element 21B; the red emission layer 32 is formed by using a mask 22c through an opening 23c in the form of slits to have a prescribed pattern for the red emission element 21R; the electron transfer layer 2 is formed by using the mask 22a through the large opening 23a as common to the elements; and the cathode 1 is formed by using a mask (not shown in the figure) to have a prescribed pattern for the elements.

As a result, the emission elements 21B, 21G and 21R each in the form of stripes are formed on the transparent electrode 5 on the common glass substrate 6, as shown in FIG. 8. These stripes are divided into each of the emission regions by an insulating layer (not shown in the figure). By forming the emission elements on the transparent electrode 5 to have the same pattern, the carrier transfer property between the cathode and the anode is improved, and voltage drop between the electrodes can be reduced.

Figure 9A:
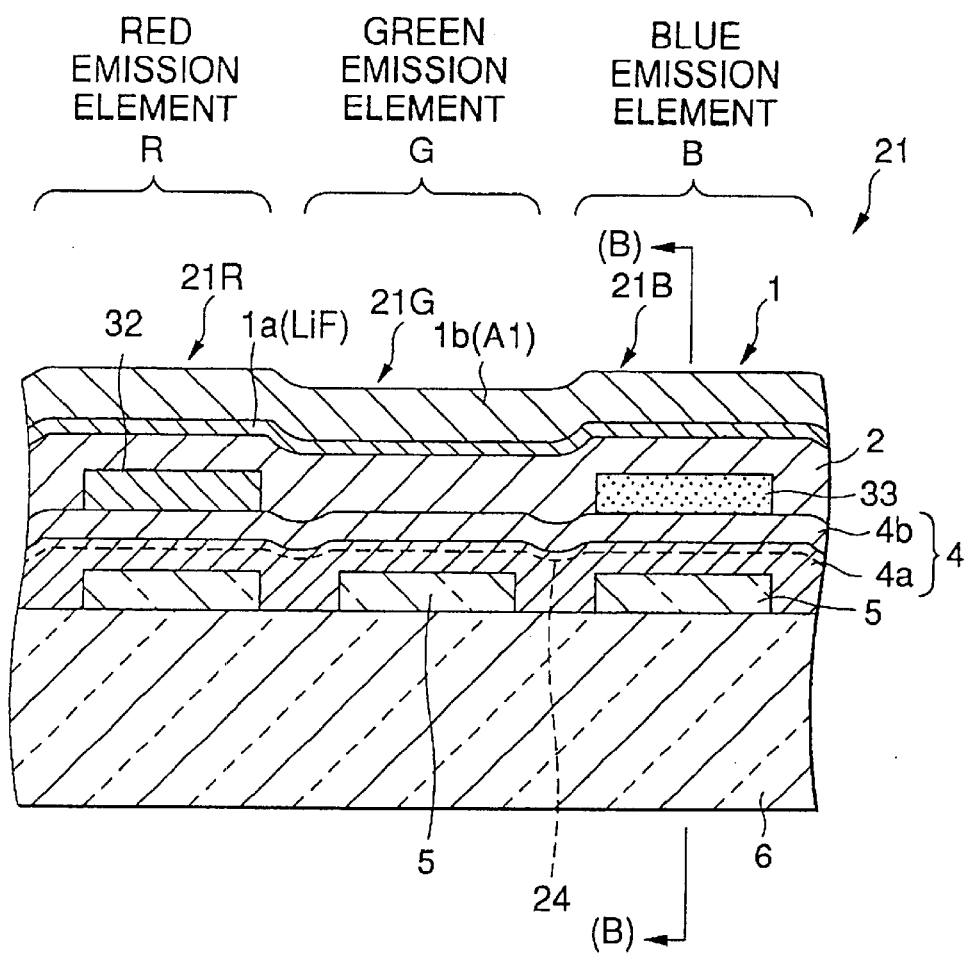
FIG. 9A is a cross sectional view perpendicular to the anode of an important part of the organic EL device according to the invention.
Figure 9B:
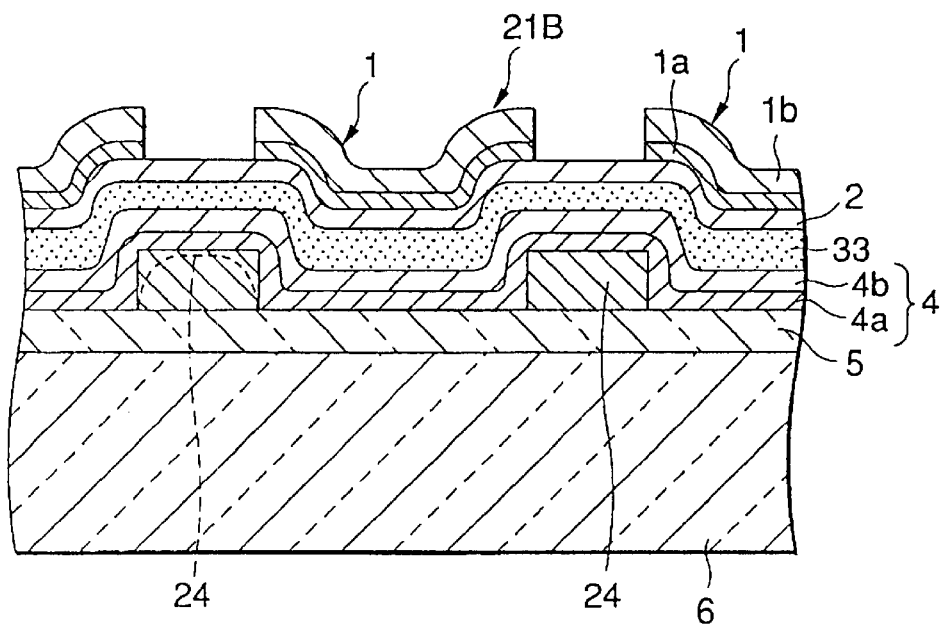
FIG. 9B is a cross sectional view along the anode taken along (B)—(B) line of FIG. 9A.
Figure 10:
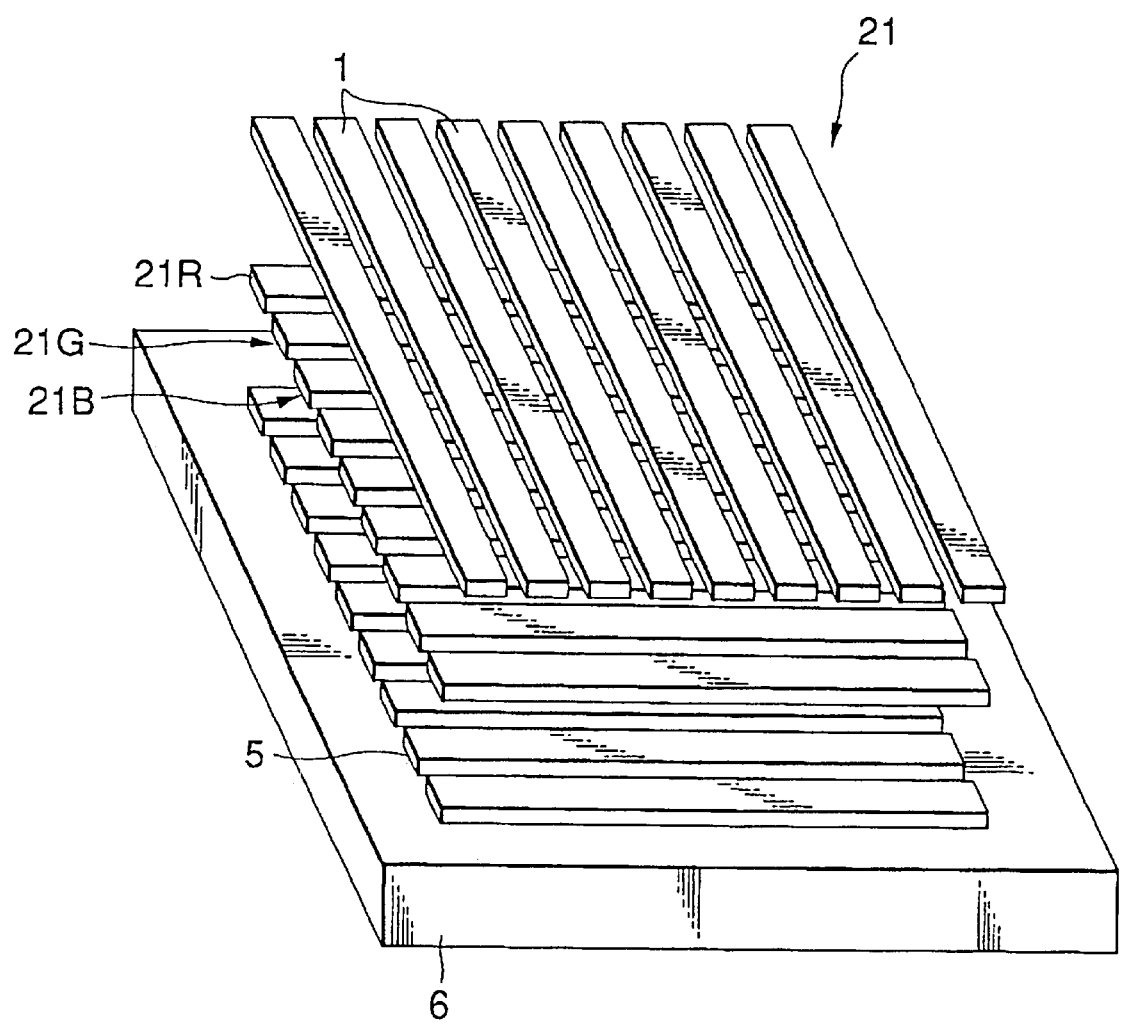
FIG. 10 is a schematic disintegrated perspective view of the organic EL device as shown in FIGS. 9A and 9B.

FIGS. 9A, 9B and 10 show a specific example of the organic EL device 21 produced by the vapor deposition apparatus described above. After vapor depositing an ITO transparent electrode to be a line electrode on a glass substrate 6, $SiO_2$ 24 is vapor deposited by the vacuum deposition method in the column direction to have a prescribed pattern to expose the transparent electrode 5 between the $SiO_2$ in the form of the pixel pattern. Then, organic layers 4a, 4b, 33, 32 and 2, and a metallic electrode 1 as a column electrode (for example, a laminated body of an LiF layer 1a and an Al layer 1b) are formed in this order by using vapor deposition masks in the column direction to have the stripe pattern, so as to produce a matrix. The vapor deposition masks 22a, 22b and 22c are used for forming the organic layers 4, 2, 33 and 32. While the organic layers 33 and 32 are formed on the transparent electrode 5 in the line direction, they may be formed in the column direction perpendicular to the transparent electrode 5.

According to the organic EL device 21, in each of the emission elements, because the emission regions are independently present in each of the hole transfer layer 4 (4a and 4b) and the electron transfer layer 2 (32), and the hole transfer layer 4 (4a and 4b) and the electron transfer layer 2 are formed from the common materials, respectively, in each of the emission elements, a laminated body in the form of stripes (matrix) exhibiting emission light of each of the colors can be produced by a simple process with a low cost. Furthermore, because it has the organic layers 4a, 4b and 2 formed in a large area, the film formation properties are improved including on the insulating layer 24, and stable performance with high reliability with a small leakage current between the cathode and the anode can be obtained. This effect can be further improved by making the shape of the upper surface of the insulating layer 24 to have curved surface, as shown by the broken line in FIG. 9B.

In the vapor deposition apparatus 11 described above, a shape and a size of the pixels can be changed other than one having the pixels shown in FIGS. 9A, 9B and 10, and a number of small pixels can be individually formed, whereas a large pixel can be singly formed.

The transparent electrode, the organic hole transfer layer, the organic hole block layer, the red emission layer, the organic electron transfer layer and the metallic electrode of the electroluminescence device described above each may have a laminated structure comprising plural layers.

The organic layers of the electroluminescence device may be formed by other film formation methods utilizing sublimation or evaporation, or methods such as spin coating or casting.

The hole transfer emission layer of the electroluminescence device may be formed with co-evaporation of a slight amount of molecules for controlling the emission spectrum of the device. For example, it may be an organic thin film containing a slight amount of an organic substance, such as a perylene derivative and a coumarin derivative.

While the electroluminescence device is suitable for emission of three colors R, G and B, other emission colors can be obtained depending on the species of the emission materials used.

Examples of the material that can be used as the hole transfer material include benzidine and its derivatives, styrylamine and its derivatives, and triphenylmethane and its derivatives, as well as porphyrin and its derivatives, triazole and its derivatives, imidazole and its derivatives, oxadiazole and its derivatives, polyarylalkane and its derivatives, phenylenediamine and its derivatives, arylamine and its derivatives, oxazole and its derivatives, anthracene and its derivatives, fluorenone and its derivatives, hydrozone and its derivatives, and stilbene and its derivatives, or a monomer, an oligomer or a polymer of a heterocyclic conjugated system such as a polysilane series compound, a vinylcarbazole series compound, a thiophene series compound, and an aniline series compound.

Specifically, α-naphthylphenyldiamine, porphyrin, metallic tetraphenylporphyrin, metallic naphthalocyanine, 4,4'4"-trimethyltriphenylamine, 4,4',4"-tris(3-methylphenylphenylamino)triphenylamine, N,N,N',N'-tetrakis(p-tolyl)p-phenylenediamine, N,N,N',N'-tetraphenyl-4,4'-diaminebiphenyl, N-phenylcarbazole, 4-di-p-tolylaminostilbene, poly(paraphenylenevinylene), poly(thiophenevinylene), poly(2,2'-thenylpyrrol), etc. can be exemplified, but it is not limited to them.

Examples of the materials that can be used as the electron transfer material include quinoline and its derivatives, perylene and its derivatives, bis-styryl and its derivatives, pyrazine and its derivatives, etc.

Specifically, 8-hydroxyquinoline aluminum, anthracene, naphthalene, phenanthrene, pyrene, chrysene, perylene, butadiene, coumarin, acridine, stilbene, and their derivatives, etc. can be exemplified.

Examples of the materials for red emission include BSB-BCN, as well as the above-described electron transfer materials doped with DCM, DCM2, Nile Red, phenoxazine, etc.

The anode and the cathode of the electroluminescence device described above are not limited in materials used.

For the cathode material, a metal having a work function of a small difference from the vacuum level of the electrode material is preferably used to effectively inject an electron. In addition to an aluminum-lithium alloy, a metal having a low work function, such as aluminum, indium, magnesium, silver, calcium, barium and lithium, may be used singly, or as an alloy with other metal to improve the stability.

While ITO as a transparent electrode is used as the anode in the example described later for withdrawing organic electroluminescence light from the side of the anode, in order to effectively inject a hole, one having a work function with a large difference from the vacuum level of the anode material, such as gold, a mixture of tin dioxide and antimony and a mixture of zinc oxide and aluminum, may be used.

An organic electroluminescence device for full color or multi-color emitting three colors R, G and B can be produced by selecting the emission materials. The invention can be applied not only for a display, but also for an organic electroluminescence device for a light source, as well as other optical uses.

The organic electroluminescence device may be sealed with germanium oxide, etc. to avoid influence of oxygen in the air to improve the stability, and the device is operated under withdrawing to vacuum.

Second Embodiment

Figure 11:
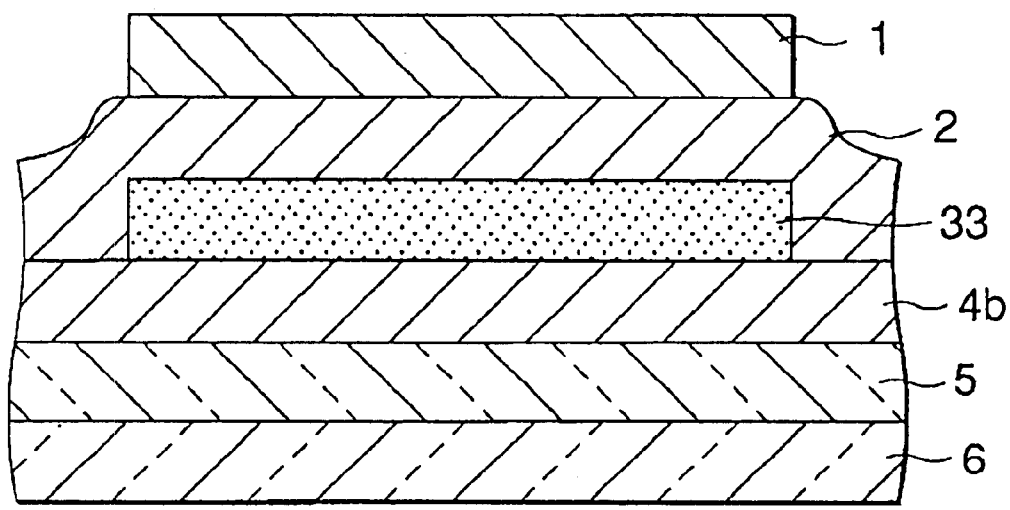
FIG. 11 is a schematic cross sectional view of an important part of the organic EL device in a second embodiment according to the first aspect of the invention.

FIG. 11 is a schematic cross sectional view showing an important part of a blue emission element 21B in a second embodiment according to the first aspect of the invention.

In the organic EL device according to this embodiment, there is differences from the device of FIGS. 4A to 4C in that a hole transfer emission layer 4b is formed on an ITO transparent electrode 5, and the hole transfer emission layer is formed in the form of a single layer. The green emission element 21G and the red emission element 21R other than this are the same as the device of FIGS. 4A to 4C.

Third Embodiment

Figure 12:
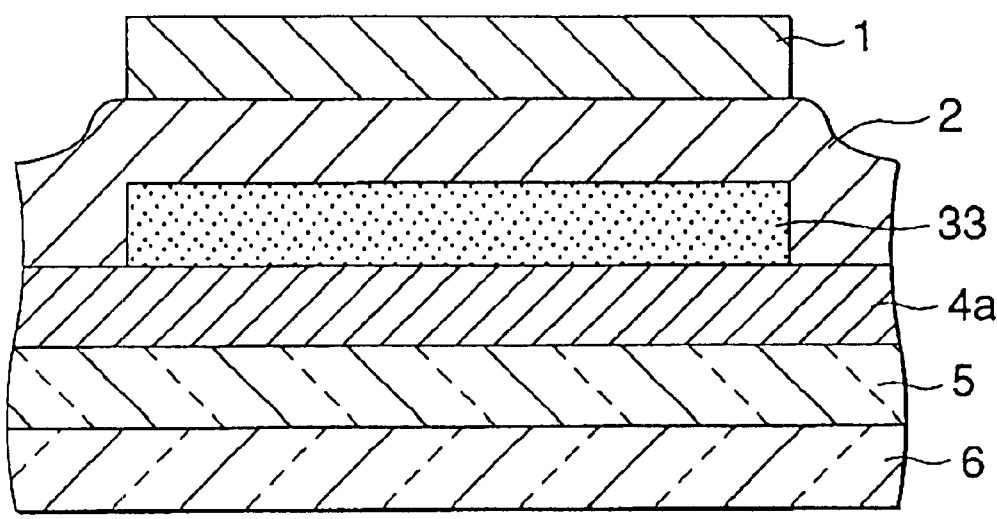
FIG. 12 is a schematic cross sectional view of an important part of the organic EL device in a third embodiment according to the first aspect of the invention.

FIG. 12 is a schematic cross sectional view showing an important part of a blue emission element 21B in a third embodiment according to the first aspect of the invention.

In the organic EL device according to this embodiment, there is differences from the device of FIGS. 4A to 4C in that a hole transfer layer (also serving as a hole transfer emission layer) 4a is formed on an ITO transparent electrode 5, and the hole transfer emission layer is formed in the form of a single layer, as similar to the second embodiment described above. The other parts than this are the same as the second embodiment.

Fourth Embodiment

Figure 13A:
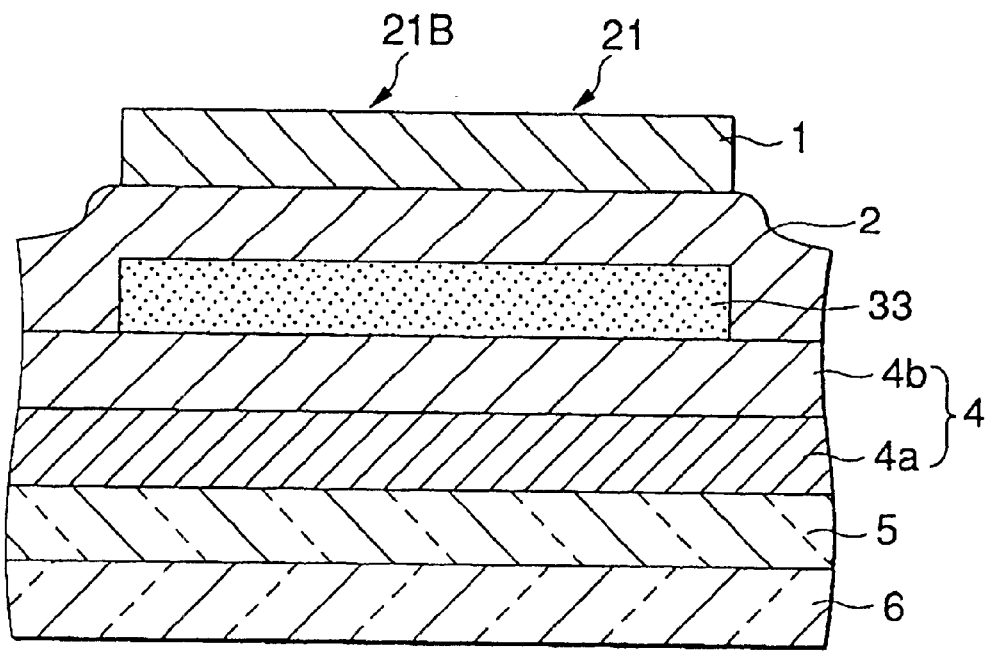
Figure 13B:
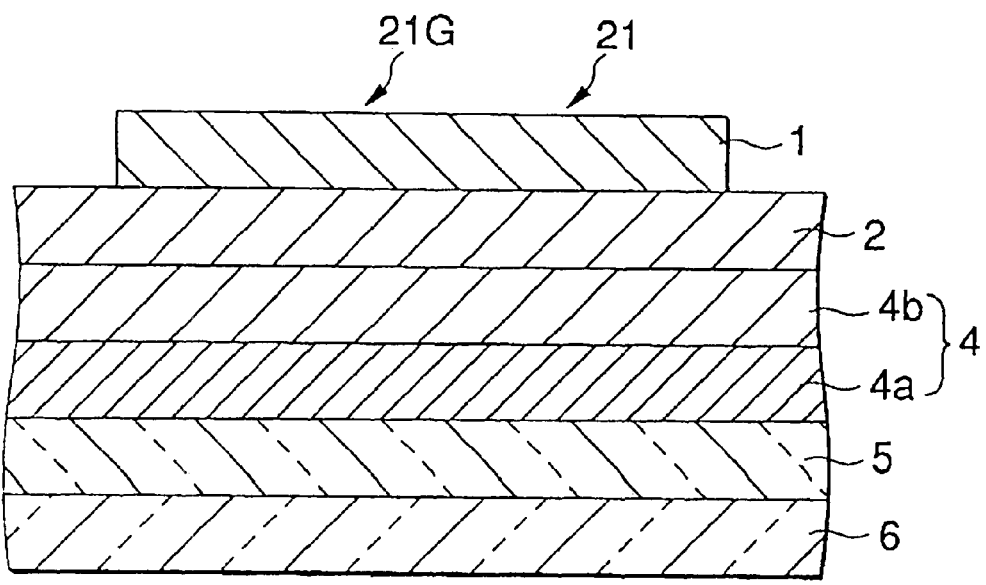

FIGS. 13A and 13B are schematic cross sectional views showing an important part of an organic EL device 21 in a fourth embodiment according to the second aspect of the invention.

The organic EL device 21 of this embodiment comprises an organic electroluminescence elements 21B (blue) and 21G (green) each comprising a laminated body of amorphous organic thin films for emission of two kinds of light on a common glass substrate 6.

In the blue emission element 21B shown in FIG. 13A, a transparent electrode 5 comprising an indium oxide, etc. (hereinafter the same) doped with ITO or Zn is formed on the glass substrate 6 as a row or line electrode by a method such as sputtering or vacuum evaporation, and a hole transfer emission layer 4a for blue emission, a hole transfer emission layer 4b, a hole block layer 33, an electron transfer layer (or an electron transfer emission layer) 2, and a cathode 1 as a column electrode are laminated thereon in this order by a vacuum evaporation method.

In the green emission element 21G shown in FIG. 13B, the transparent electrode 5 comprising ITO, etc. is formed on the glass substrate 6 by a method such as sputtering or vacuum evaporation, and the hole transfer emission layers 4a and 4b, an electron transfer layer 2 for green emission, and the cathode 1 as a column electrode are laminated thereon in this order by a vacuum evaporation method, with the hole block layer being not provided.

The characteristic feature of the organic EL device 21 of FIGS. 17A and 17B resides in that the transparent electrode 5 is formed as a row electrode or a line electrode, which is common in two kinds of the emission elements 21B and 21G, on the glass substrate 6, which is common in the emission elements; on the transparent electrode, the hole transfer emission layers 4a and 4b formed from the hole transfer layer forming material, which are common to each other, are formed on a region containing the emission elements, are formed; the electron transfer layers 2 are formed from the electron transfer layer forming material, which is common in the emission elements, on the region containing the hole transfer layers; and on the electron transfer layers, the cathodes 1 are formed for the respective emission elements to face the transparent electrode 5 (or in the form of a matrix pattern). The emission elements each have a unique layer constitution, and the blue emission element 21B has the hole block layer 33, for example, in the form of a stripe pattern, but the hole block layer 33 is not provided for the green emission element 21G.

Therefore, in each of the emission elements, because the emission regions are independently present in the hole transfer layers 4 (4a and 4b) and the electron transfer layers 2, and the hole transfer layers 4 (4a and 4b) and the electron transfer layers 2 each comprises the common materials for the emission regions, the laminated body exhibiting emission of each colors of light can be easily produced with a low cost. Furthermore, on the whole surface of an effective pixel region, by forming the common layers by using a mask with a large opening, the film formation property and the step coverage property become well, and a leakage current between the cathode and the anode can be reduced. Because it can exhibit two-color display, it is suitable for display of characters.

As a result, the emission elements 21B and 21G are formed on the transparent electrode 5 on the common glass substrate 6, as shown in FIG. 14. These may be in the form of stripes, and the stripes may be divided into each of the emission regions by an insulating layer (not shown in the figure). In this case, by forming the emission elements on the transparent electrode 5 to have the same pattern, the carrier transfer property between the cathode and the anode is improved, and voltage drop between the electrodes can be reduced. While the organic layer 33 is formed in the line direction on the transparent substrate 5, it may be formed in the column direction perpendicular to the transparent substrate 5.

Figure 15:
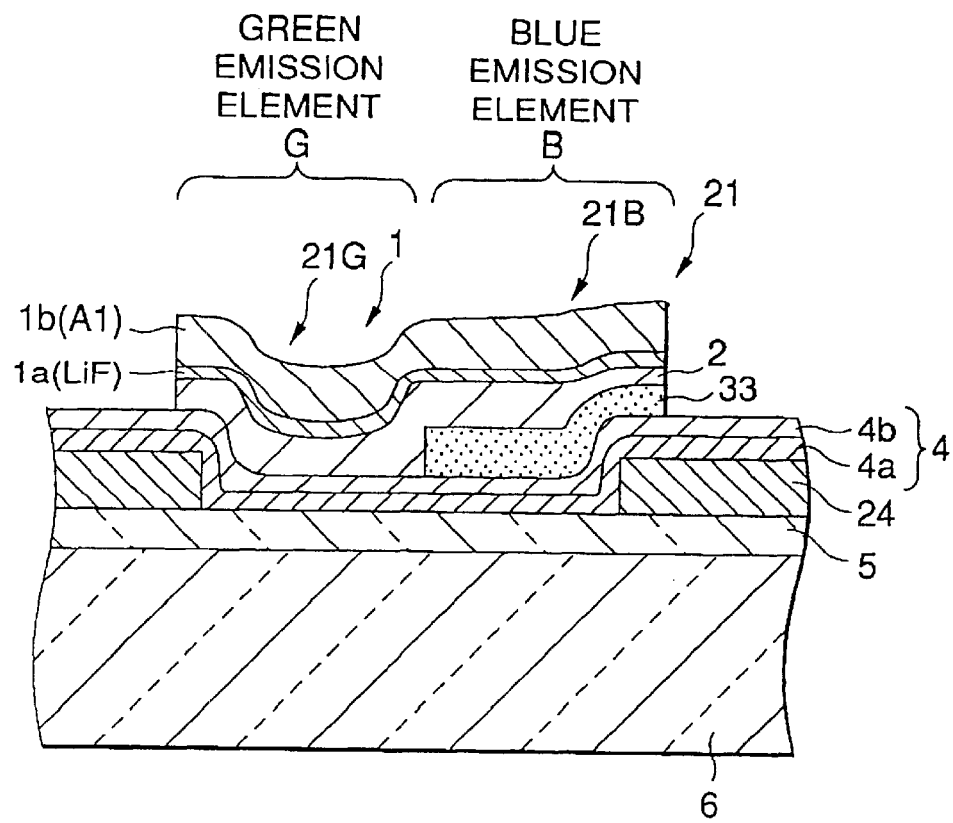
FIG. 15 is a cross sectional view of an important part of the organic EL device according to an example of the invention.
Figure 16A:
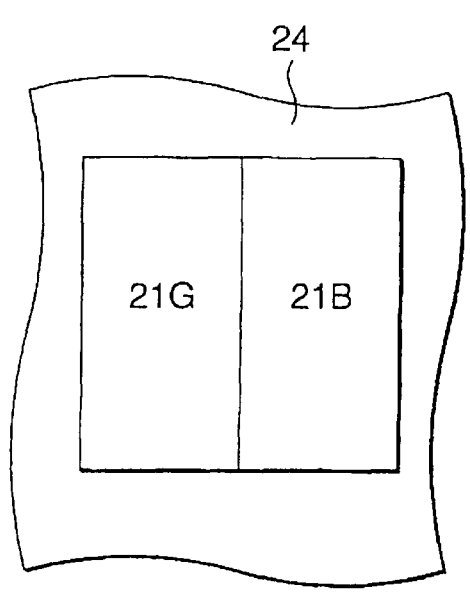
FIGS. 16A and 16B are schematic plan views of an important part of the organic EL device as shown in FIG. 15.
Figure 16B:
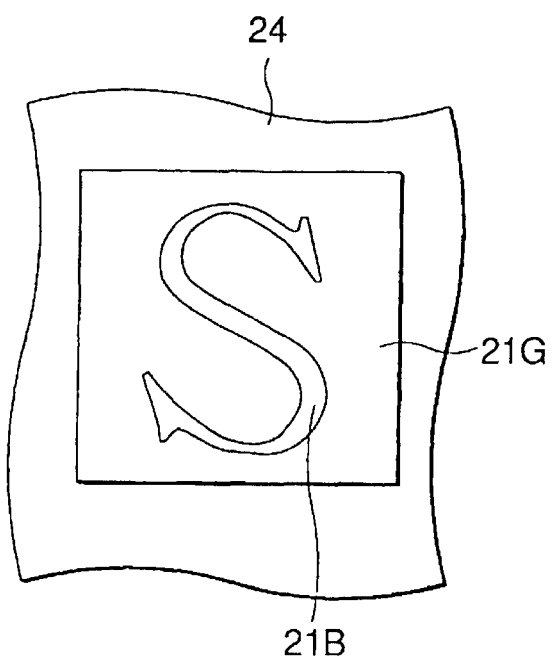
Figure 18:
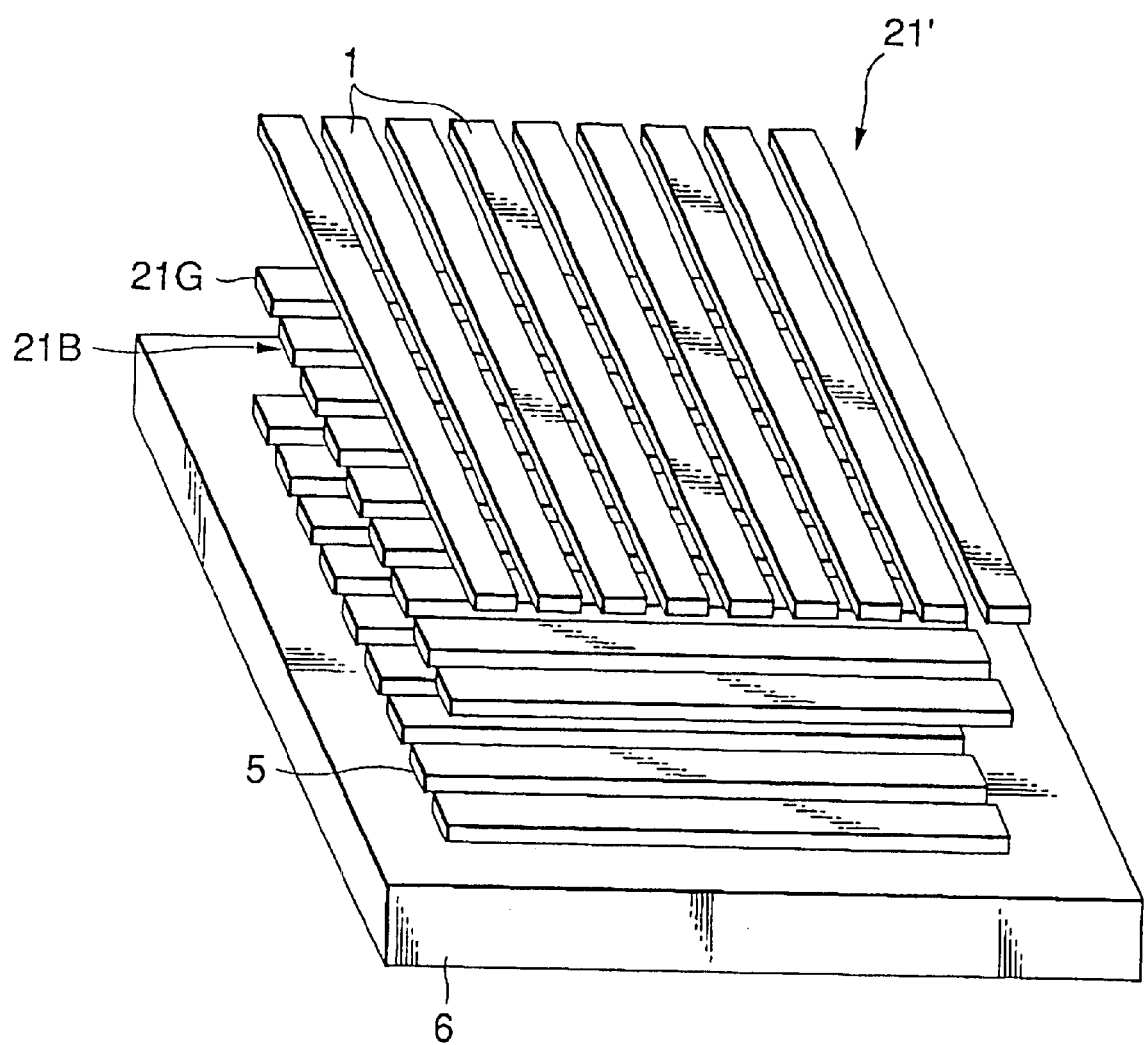
FIG. 18 is a schematic disintegrated perspective view of the organic EL device as shown in FIGS. 17A and 17B.

FIGS. 15, 16A, 16B, 17A, 17B and 18 show two kinds of specific examples of the organic EL devices 21 and 21' produced by the vapor deposition apparatus described above. In the example shown in FIGS. 15, 16A and 16B, an ITO transparent electrode 5 is vapor deposited on a glass substrate 6 by using the vapor deposition apparatus described above, and a blue emission element 21B and a green emission element 21G are formed as connecting to each other in the region surrounded by an insulating layer 24 such as $SiO_2$, where the transparent electrode 5 is exposed in the form of the pixel pattern inside the insulating layer. Then, organic layers 4a, 4b, 33 and 2, and a metallic electrode 1 (for example, a laminated body of an LiF layer 1a and an Al layer 1b) are commonly formed on the emission elements. This example is suitable for displaying characters as shown in FIG. 16B utilizing the emission pattern schematically shown in FIG. 16A. In the example shown in FIGS. 17A, 17B and 18, after vapor depositing an ITO transparent electrode 5 to be a line electrode, $SiO_2$ 24 is vapor deposited in the column direction to have a prescribed pattern to expose the transparent electrode 5 between the $SiO_2$ in the form of the pixel pattern. Then, organic layers 4a, 4b, 33 and 2 are formed, and an electrode 1 is formed as a column electrode in the form of a stripe pattern in the column direction, so as to produce a matrix. The vapor deposition masks 22a, 22b and 22c are used for forming the organic layers 4, 2 and 33.

Fifth Embodiment

Figure 19:
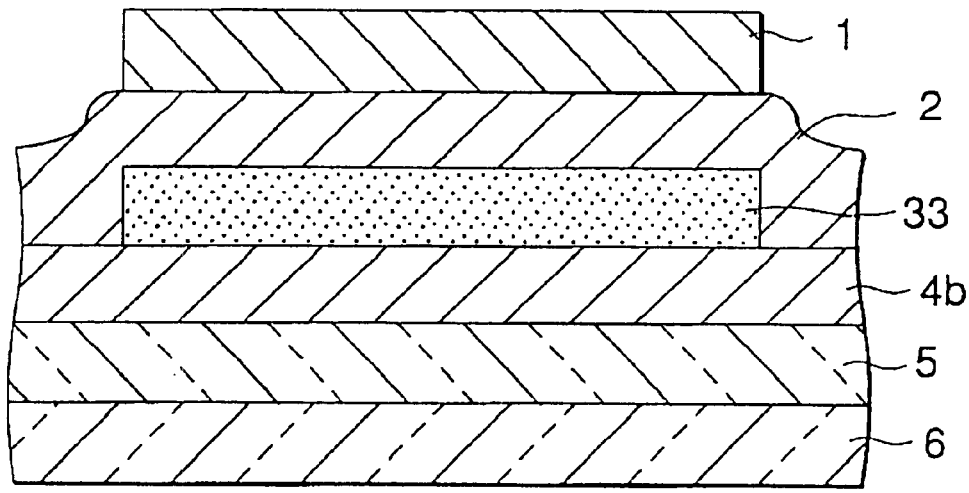
FIG. 19 is a schematic cross sectional view of an important part of the organic EL device in a fifth embodiment according to the second aspect of the invention.

FIG. 19 is a schematic cross sectional view showing an important part of a blue emission element 21B in a fifth embodiment according to the second aspect of the invention.

In the organic EL device according to this embodiment, there is differences from the device of FIGS. 17A and 17B in that a hole transfer emission layer 4b is formed on an ITO transparent electrode 5, and the hole transfer emission layer is formed in the form of a single layer. The green emission element 21G other than this is the same as the device of FIGS. 17A and 17B.

Sixth Embodiment

Figure 20:
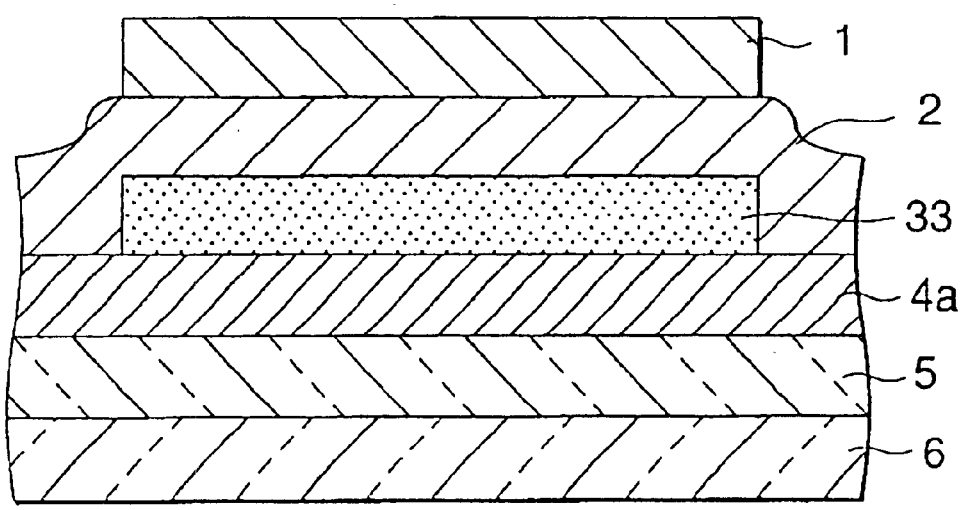
FIG. 20 is a schematic cross sectional view of an important part of the organic EL device in a sixth embodiment according to the second aspect of the invention.

FIG. 20 is a schematic cross sectional view showing an important part of a blue emission element 21B in a sixth embodiment according to the second aspect of the invention.

In the organic EL device according to this embodiment, there is differences from the device of FIGS. 17A and 17B in that a hole transfer layer (also serving as a hole transfer emission layer) 4a is formed on an ITO transparent electrode 5, and the hole transfer emission layer is formed in the form of a single layer, as similar to the second embodiment described above. The other parts than this are the same as the second embodiment.

The invention is described in more detail with reference to the examples below.

EXAMPLE 1

The specific constitution of the organic EL device 21 of this example is explained based on its production process.

In order to produce a simple matrix of 12 combinations of R, G and B stripes having a dimension of 30 mm×36 mm, 36 of ITO electrodes 5, for example, having a thickness of about 100 nm with a width of 1.15 mm and a distance of 0.1 mm, were formed on a glass substrate 6 having a dimension of 53 mm×53 mm, and 31 of insulating layers 24 with a width of 0.5 mm and a distance of 1.0 mm were formed by vapor deposition of $SiO_2$ on the column side. Therefore, the emission region of one cell for producing the organic electroluminescence device was 1.0 mm×1.15 mm, and the opening ratio was 60.8%.

On the ITO transparent electrode 5, m-MTDATA (4,4'4"-tris(3-methylphenylphenylamino)triphenylamine having the formula (12)) was vapor deposited as a hole transfer emission layer 4a by a vacuum vapor deposition method under vacuum to a thickness of 30 nm at a vapor deposition rate of from 0.2 to 0.4 nm/sec on the whole surface including the ITO electrode 5 by using a mask 22a having an opening 23a having an area of 40.0 mm×48.0 mm.

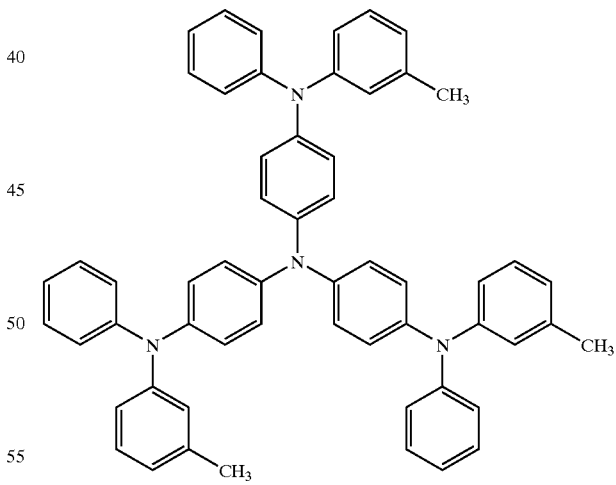

(12)

On the hole transfer emission layer 4a, α-NPD (α-naphtylphenyldiamine having the formula (13), which could be α-PPD of the formula (14), α-TPD of the formula (15) or TPD of the formula (16)) was vapor deposited as a hole transfer emission layer 4b at a thickness of 50 nm (vapor deposition rate: from 0.2 to 0.4 nm/sec), so as to form a hole transfer layer 4 having a two-layer structure having an emission function.

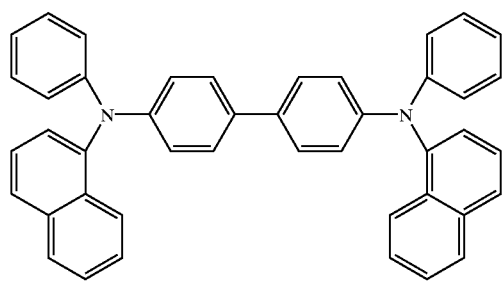
(13)

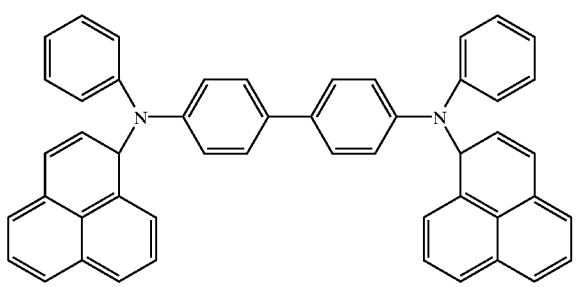
(14)

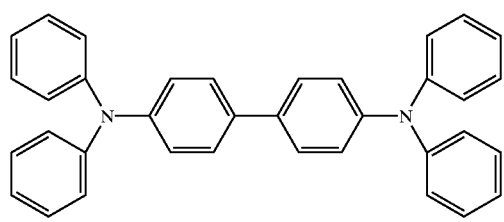
(15)

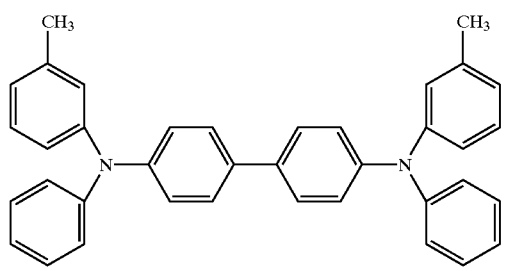
(16)

On the hole transfer layer 4, a phenanthroline derivative, such as bathocuproine (2,9-dimethyl-4,7-diphenyl-1,10-phenanthroline having the formula (3)) was vapor deposited (vapor deposition rate: from 0.2 to 0.4 nm/sec) on the transparent electrode 5 as a hole block layer 33 at a thickness of 20 nm in the stripe pattern of 1.15 mm×48.0 mm, which was an emission region of the ITO electrode 5, with changing to a mask 22b having 12 openings 23b having a stripe form having an area of 1.16 mm×49 mm.

On the hole transfer layer 4, BSB-BCN (having the formula (17)) was vapor deposited (vapor deposition rate: from 0.2 to 0.4 nm/sec) on the transparent electrode 5 as an electron transfer red emission material layer 32 at a thickness of 20 nm in the stripe pattern of 1.15 mm×48.0 mm, which was an emission region of the ITO electrode 5, with changing to a mask 22c having 12 openings 23c having a stripe form having an area of 1.16 mm×49 mm.

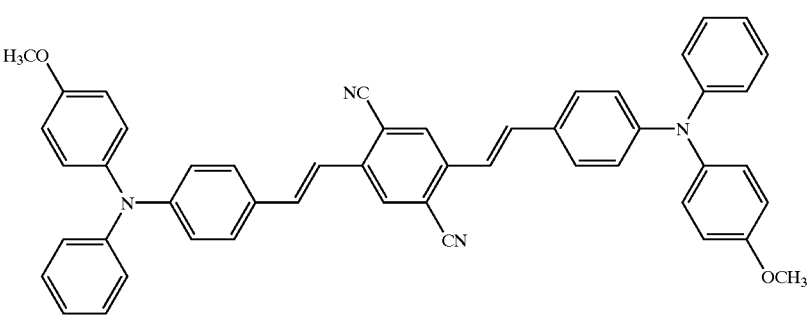
(17)

After changing to the mask 22a having the mask opening 23a having an area of 40.0 mm×48.0 mm, Alq$_3$ (8-hydorxy quinoline aluminum having the formula (18)) was vapor deposited at a thickness of 40 nm as an electron transfer layer or an electron transfer emission layer 2.

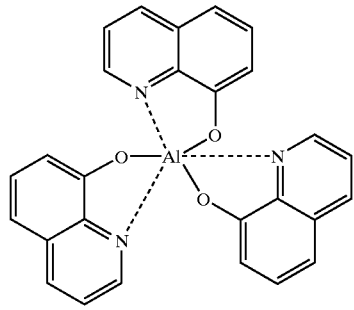

(18)

After changing to a mask having an opening having an area of 1.16 mm×49 mm, Al—Li (an aluminum-lithium alloy: Li concentration: about 1 mol %) was vapor deposited at a thickness of about 0.5 nm as a cathode 1, followed by further vapor depositing Al at a thickness of about 200 nm, to produce an organic EL device 21 corresponding to R, G and B shown in FIGS. 9A and 9B.

The device characteristics were measured for the organic EL device of this example, and the results are shown below.

FIG. 6 is a graph showing the spectral characteristics of the organic EL device 21 of Example 1 shown in FIGS. 9A and 9B. The maximum emission wavelength in the emission region containing bathocuproine functioning as a hole block layer was 460 nm, and the coordinates on the CIE chromaticity coordinates were (0.155, 0.11), which resulted in good blue emission. It was apparent from the shape of the emission spectrum that it was emission from α-NPD. From the emission parts in the absence of bathocuproine, emission from Alq$_3$ as the electron transfer emission material was obtained, from which good green emission having the maximum emission wavelength of 520 nm and CIE (0.33, 0.55) was obtained. From the parts in the form of stripes, on which BSB-BCN was vapor deposited between α-NPD and Alq$_3$, good red emission having the maximum emission wavelength of 635 nm and CIE (0.60, 0.39) was obtained.

Figure 21:
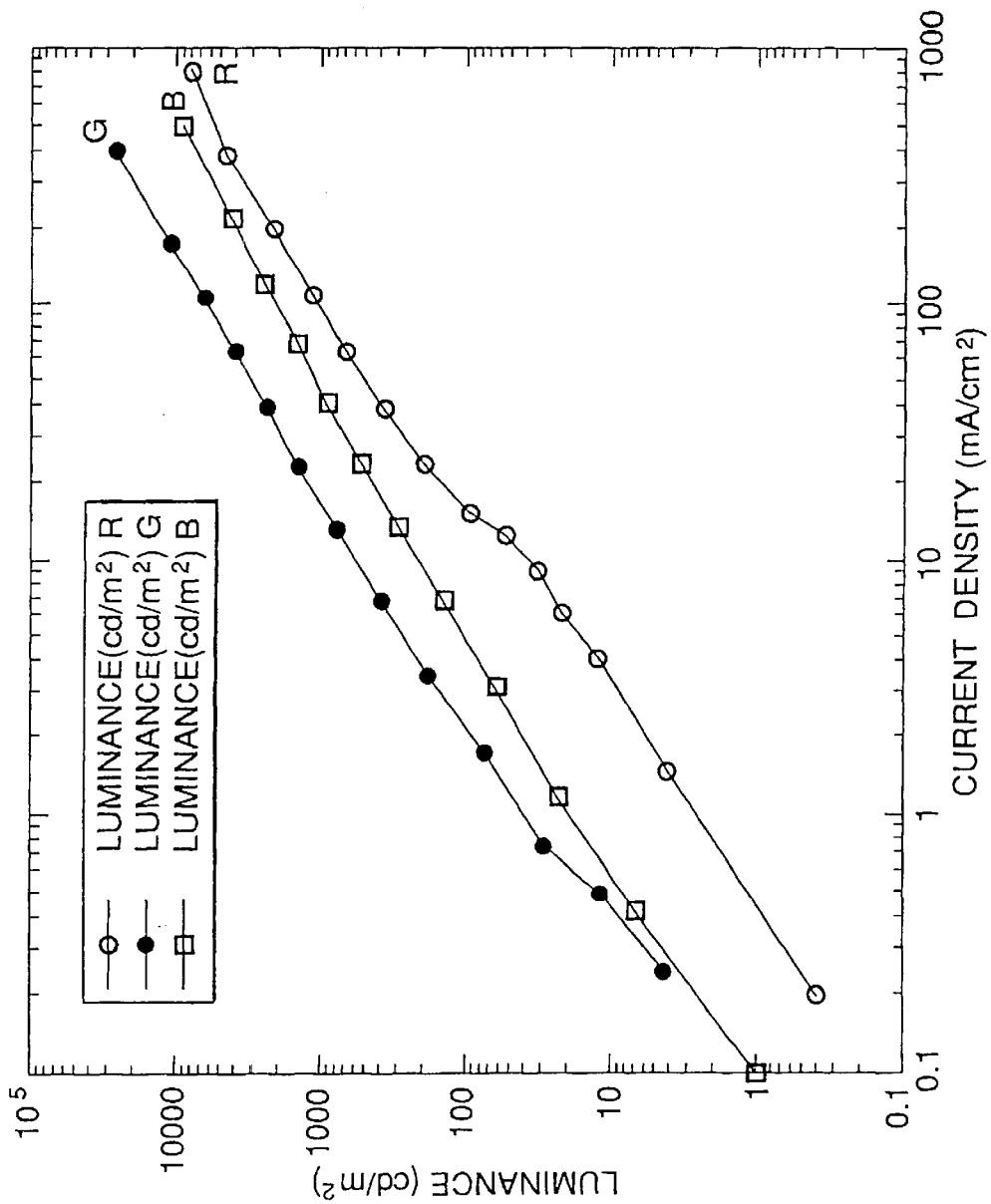
FIG. 21 is a graph showing the current-luminance characteristics of the organic EL device according to Example 1.

With respect to the luminance shown in FIG. 21, in the blue emission part, it was 10,000 cd/m$^2$ at a current density of 500 mA/cm$^2$, and the emission efficiency was 1.21 m/W at a current density of 1 mA/cm$^2$. In the green emission part, it was 7,000 cd/m$^2$ at a current density of 100 mA/cm$^2$, and the emission efficiency was 1.11 m/W at a current density of 1 mA/cm$^2$. In the red emission part, it was 5,600 cd/m$^2$ at a current density of 500 mA/cm$^2$, and the emission efficiency was 0.031 m/W at a current density of 1 mA/cm$^2$.

When the organic EL device was pulse driven at a duty factor of 1/100, the peak luminance converted to the direct current driven was 55,000 cd/m$^2$ at a current density of 5,500 mA/cm$^2$, and a high luminance blue emission element having high performance sufficient to practical use could be produced.

EXAMPLE 2

The specific constitution of the organic EL device 21 of this example is explained based on its production process.

In order to produce a simple matrix of 12 combinations of R, G and B stripes having a dimension of 30 mm×36 mm, 36 of ITO electrodes 5, for example, having a thickness of about 100 nm with a width of 1.15 mm and a distance of 0.1 mm, were formed on a glass substrate 6 having a dimension of 53 mm×53 mm, and 31 of insulating layers 24 with a width of 0.5 mm and a distance of 1.0 mm were formed by vapor deposition of SiO$_2$ on the column side. Therefore, the emission region of one cell for producing the organic electroluminescence device was 1.0 mm×1.15 mm, and the opening ratio was 60.8%.

On the ITO transparent electrode 5, M-MTDATA (4,4'4"-tris(3-methylphenylphenylamino)triphenylamine having the formula (12)) was vapor deposited as a hole transfer emission layer 4a by a vacuum vapor deposition method under vacuum to a thickness of 30 nm at a vapor deposition rate of from 0.2 to 0.4 nm/sec on the whole surface including the ITO electrode 5 by using a mask 22a having an opening 23a having an area of 40.0 mm×48.0 mm.

On the hole transfer emission layer 4a, α-NPD (α-naphtylphenyldiamine having the formula (13), which could be α-PPD of the formula (14), α-TPD of the formula (15) or TPD of the formula (16)) was vapor deposited as a hole transfer emission layer 4b at a thickness of 50 nm (vapor deposition rate: from 0.2 to 0.4 nm/sec), so as to form a hole transfer layer 4 having a two-layer structure having an emission function.

On the hole transfer layer 4, a phenanthroline derivative, such as bathocuproine (2,9-dimethyl-4,7-diphenyl-1,10-phenanthroline having the formula (3)) was vapor deposited (vapor deposition rate: from 0.2 to 0.4 nm/sec) on the transparent electrode 5 as a hole block layer 33 at a thickness of 20 nm in the stripe pattern of 1.15 mm×48.0 mm, which was an emission region of the ITO electrode 5, with changing to a mask 22b having 12 openings 23b having a stripe form having an area of 1.16 mm×49 mm.

On the hole transfer layer 4, DMC2 (having the formula (19)) and Alq$_3$ (8-hydorxy quinoline aluminum having the formula (18)) was vapor deposited (vapor deposition rate: from 0.2 to 0.4 nm/sec) in such a manner that the molar ratio of DCM2 was from 0.5 to 1% on the transparent electrode 5 as an electron transfer red emission material layer 32 at a thickness of 20 nm in the stripe pattern of 1.15 mm×48.0 mm, which was an emission region of the ITO electrode 5, with changing to a mask 22c having 12 openings 23c having a stripe form having an area of 1.16 mm×49 mm.

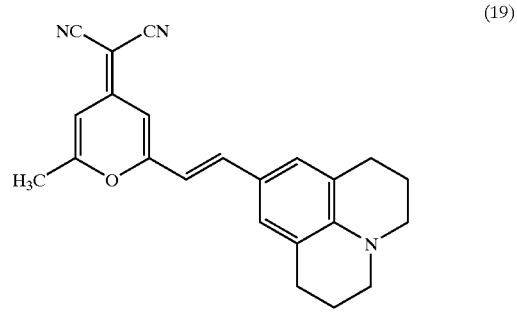

(19)

After changing to the mask 22a having the mask opening 23a having an area of 40.0 mm×48.0 mm, Alq$_3$ (8-hydorxy quinoline aluminum having the formula (18)) was vapor deposited at a thickness of 40 nm as an electron transfer layer or an electron transfer emission layer 2.

After changing to a mask having an opening having an area of 1.16 mm×49 mm, Al—Li (an aluminum-lithium alloy: Li concentration: about 1 mol %) was vapor deposited at a thickness of about 0.5 nm as a cathode 1, followed by further vapor depositing Al at a thickness of about 200 nm, to produce an organic EL device 21 corresponding to R, G and B shown in FIGS. 9A and 9B.

The device characteristics were measured for the organic EL device of this example, and the results are shown below.

As similar to the organic EL device 21 according to Example 1, the maximum emission wavelength in the emission region containing bathocuproine functioning as a hole block layer was 460 nm, and the coordinates on the CIE chromaticity coordinates were (0.155, 0.11), which resulted in good blue emission. It was apparent from the shape of the emission spectrum that it was emission from α-NPD. From the emission parts in the absence of bathocuproine, emission from $Alq_3$ as the electron transfer emission material was obtained, from which good green emission having the maximum emission wavelength of 520 nm and CIE (0.33, 0.55) was obtained. From the parts in the form of stripes, on which DCM2 and $Alq_3$ was vapor co-deposited between α-NPD and $Alq_3$, good red emission having the maximum emission wavelength of 645 nm and CIE (0.66, 0.34) was obtained.

With respect to the luminance, in the blue emission part, it was 10,000 cd/m$^2$ at a current density of 500 mA/cm$^2$, and the emission efficiency was 1.21 m/W at a current density of 1 mA/cm$^2$. In the green emission part, it was 7,000 cd/m$^2$ at a current density of 100 mA/cm$^2$, and the emission efficiency was 1.11 m/W at a current density of 1 mA/cm$^2$. In the red emission part, it was 160 cd/m$^2$ at a current density of 250 mA/cm$^2$, and the emission efficiency was 0.041 m/W at a current density of 1 MA/cm$^2$.

EXAMPLE 3

The organic EL device according to Example 3 of the invention is explained based on its production process.

The organic EL device according to this example was the same as in Example 1, except that the hole transfer emission layer 4a was not provided, and α-NPD (α-naphtylphenyldiamine having the formula (13), which could be α-PPD of the formula (14), α-TPD of the formula (15) or TPD of the formula (16)) was vapor deposited as a hole transfer emission layer 4b under vacuum to a thickness of 50 nm (vapor deposition rate: from 0.2 to 0.4 nm/sec), so as to form a hole transfer emission layer as a single layer.

Figure 22:
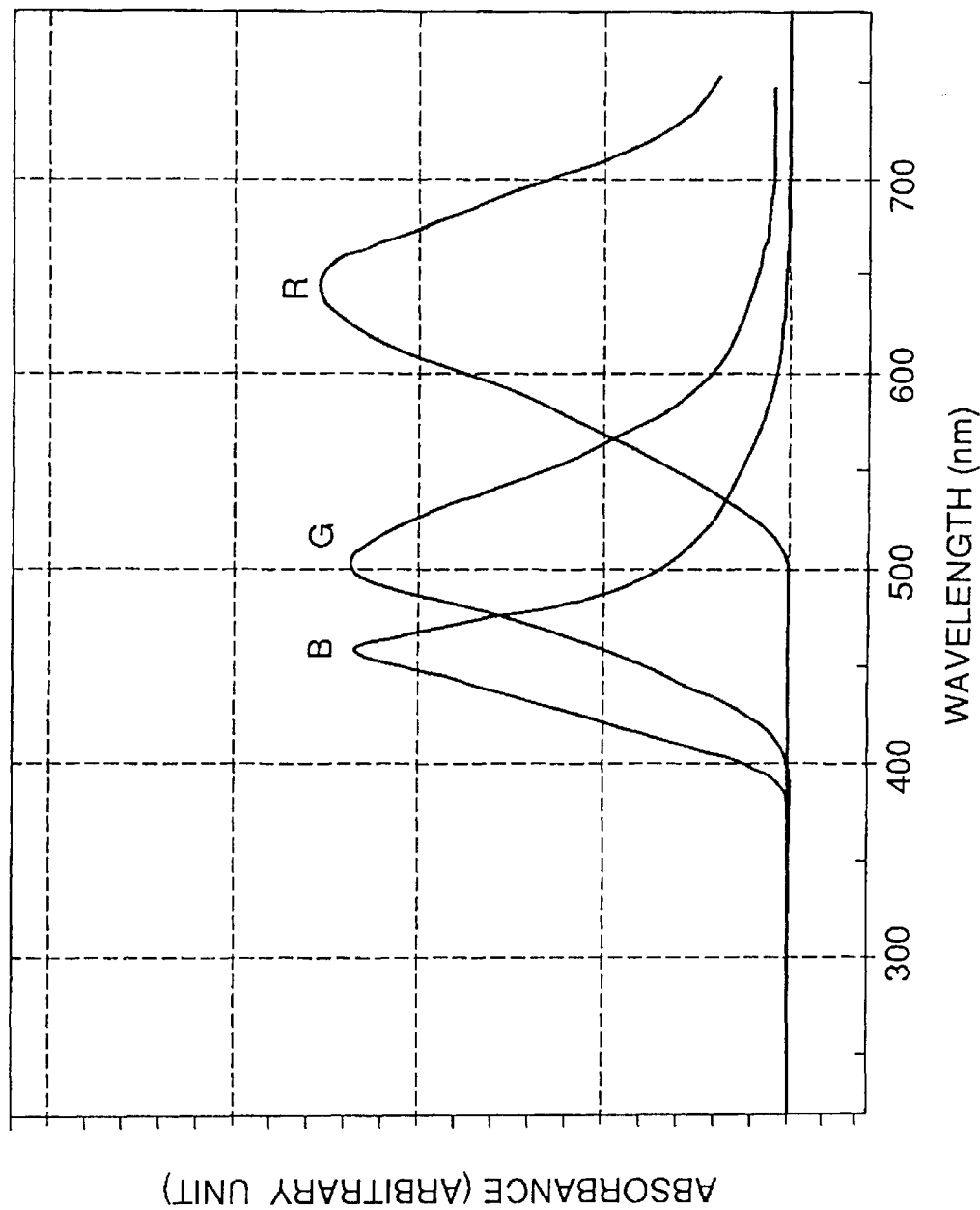
FIG. 22 is a graph showing the spectroscopic characteristics of the organic EL device according to Example 3.

FIG. 22 is a graph showing the spectral characteristics of the organic EL device according to Example 3 shown in FIG. 11.

In this example, the maximum emission wavelength (absorption peak) was about 460 nm, and the coordinates on the CIE coordinates were (0.155, 0.11), and good blue emission was exhibited. The green emission and the red emission were the same as in FIG. 6.

Figure 23:
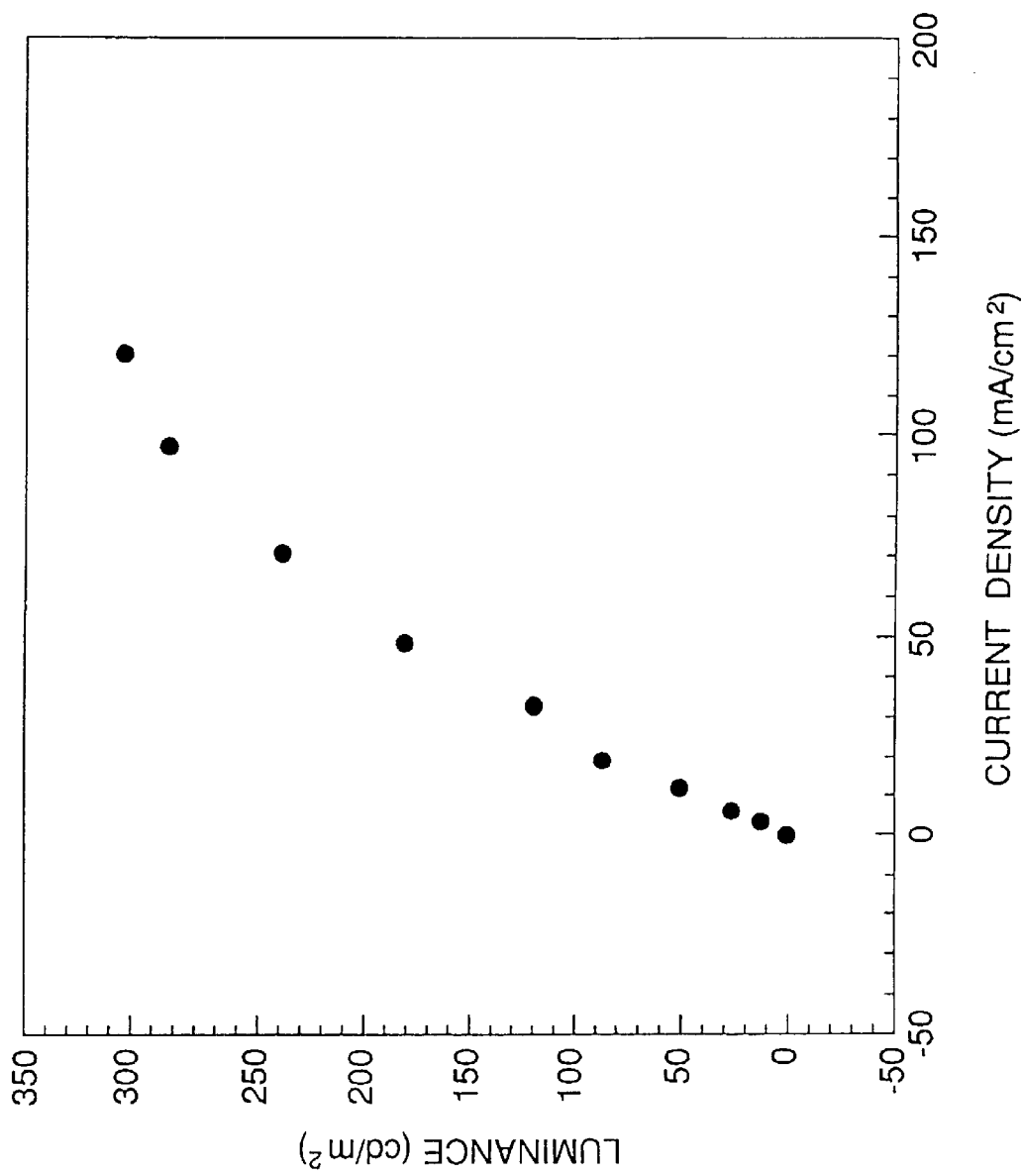
FIG. 23 is a graph showing the current-luminance characteristics of the organic EL device according to Example 3.

As shown in FIG. 23, the luminance was 1,400 cd/M$^2$ at a current density of 400 mA/cm$^2$.

It was apparent from the shape of the emission spectrum that in the blue emission part, it was emission from the hole transfer emission layer 4b comprising α-NPD.

Figure 24:
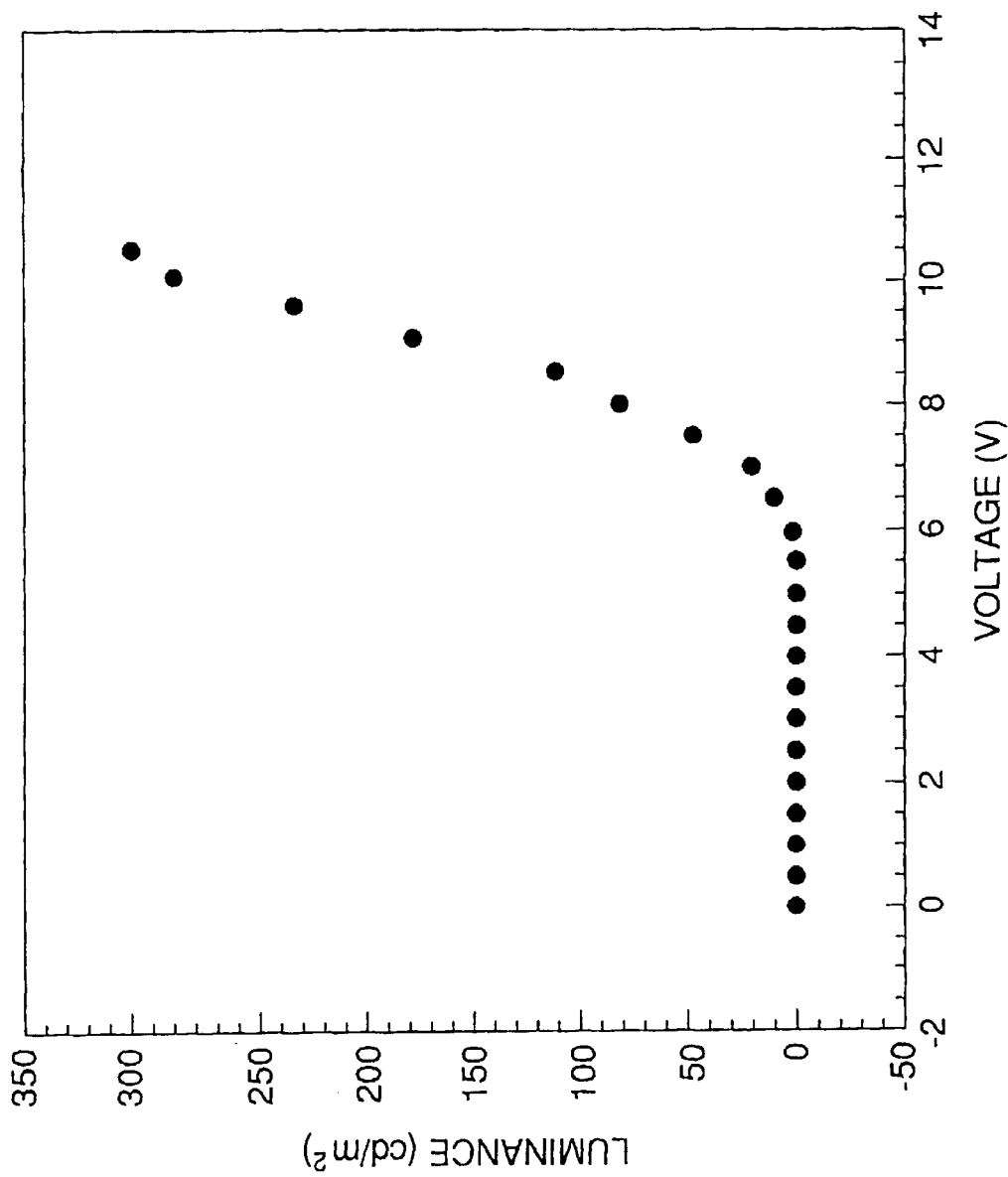
FIG. 24 is a graph showing the current-luminance characteristics of the organic EL device according to Example 3.

Furthermore, as shown by the threshold value voltage characteristics of FIG. 24, the current did substantially not flow until a voltage of about 5 V, which gradually began to flow exceeding 5 V, and it suddenly flew exceeding 6 V. This means that it can be driven with a low voltage, and its threshold value voltage characteristics are good.

EXAMPLE 4

The organic EL device according to Example 4 of the invention is explained based on its production process.

In the organic EL device according to this example, m-MTDATA (4,4'4"-tris(3-methylphenylphenylamino) triphenylamine having the formula (12)) was vapor deposited as a hole transfer emission layer 4a by a vacuum vapor deposition method under vacuum to a thickness of 50 nm (vapor deposition rate: from 0.2 to 0.4 nm/sec), and a hole transfer emission layer was formed as a single layer as similar to Example 3 described above.

Figure 25:
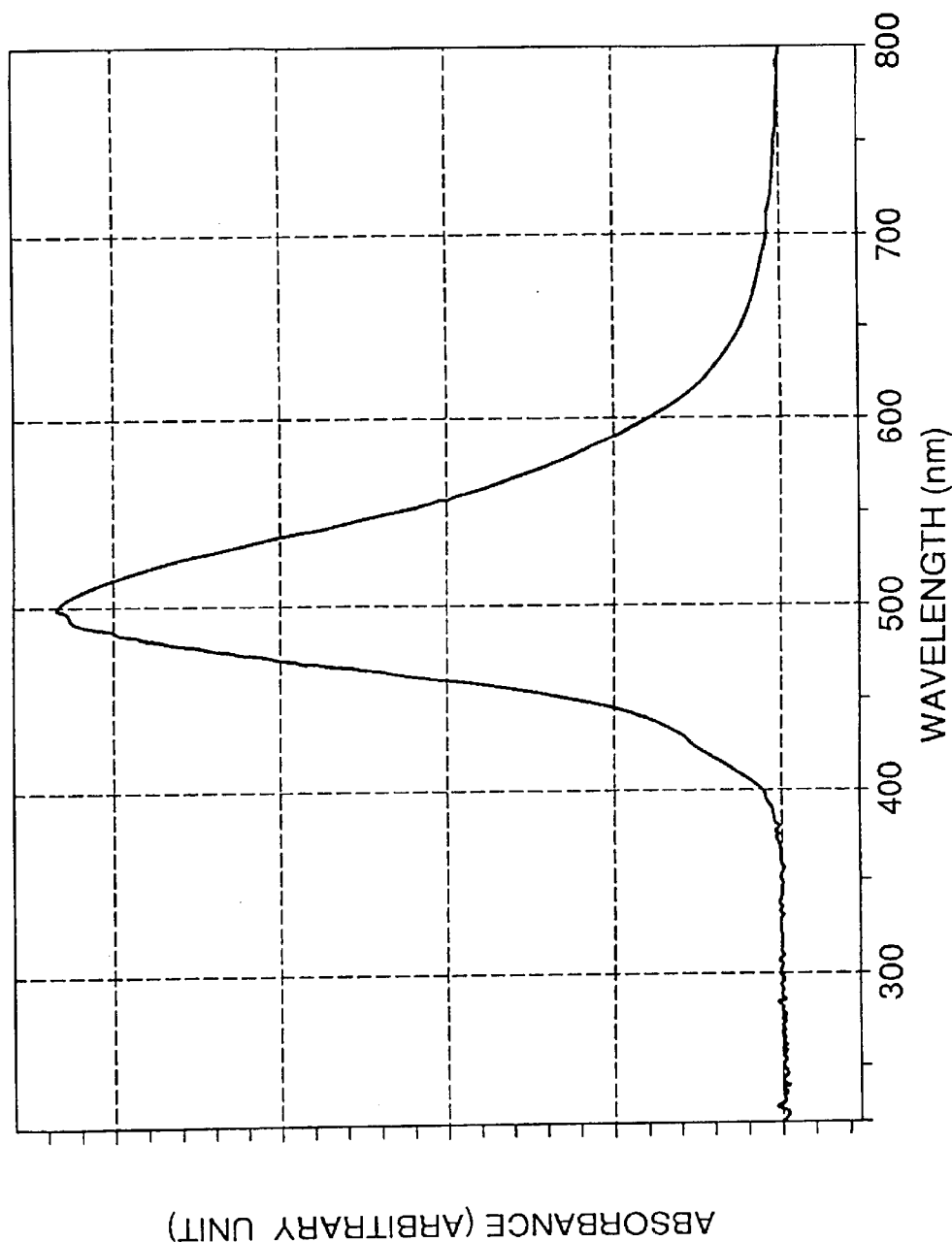
FIG. 25 is a graph showing the spectroscopic characteristics of the organic EL device according to Example 4.

FIG. 25 is a graph showing the spectral characteristics of the organic EL device according to Example 4 shown in FIG. 12.

In this example, the maximum emission wavelength (absorption peak) was about 500 nm, and the coordinates on the CIE coordinates were (0.26, 0.47), and good green emission was exhibited. The red emission was the same as in FIG. 6.

Figure 26:
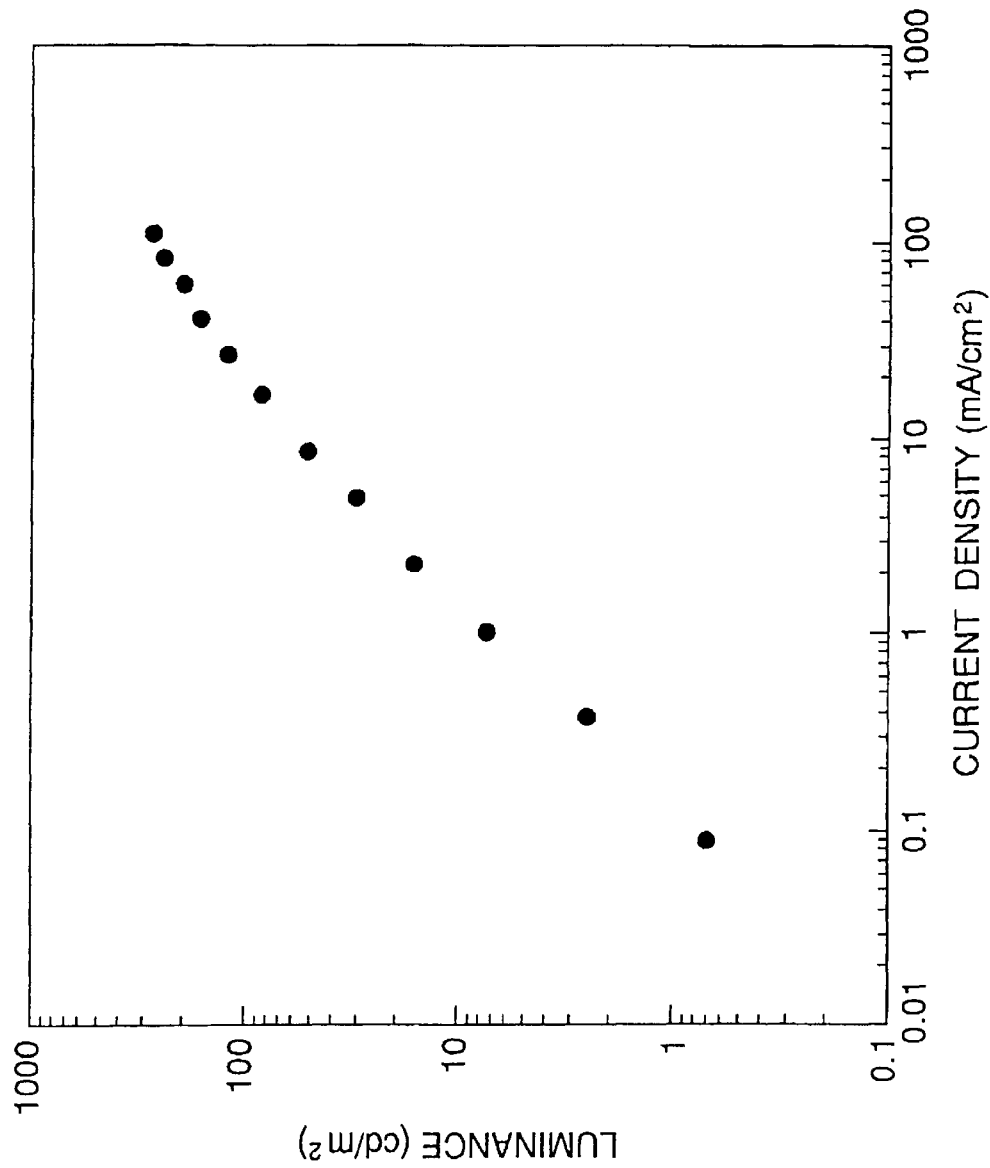
FIG. 26 is a graph showing the current-luminance characteristics of the organic EL device according to Example 4.

As shown in FIG. 26, the luminance was 280 cd/m$^2$ at a current density of 110 mA/cm$^2$ in the blue emission part.

It was apparent from the shape of the emission spectrum that it was emission from the hole transfer emission layer 4a comprising m-MTDATA.

Figure 27:
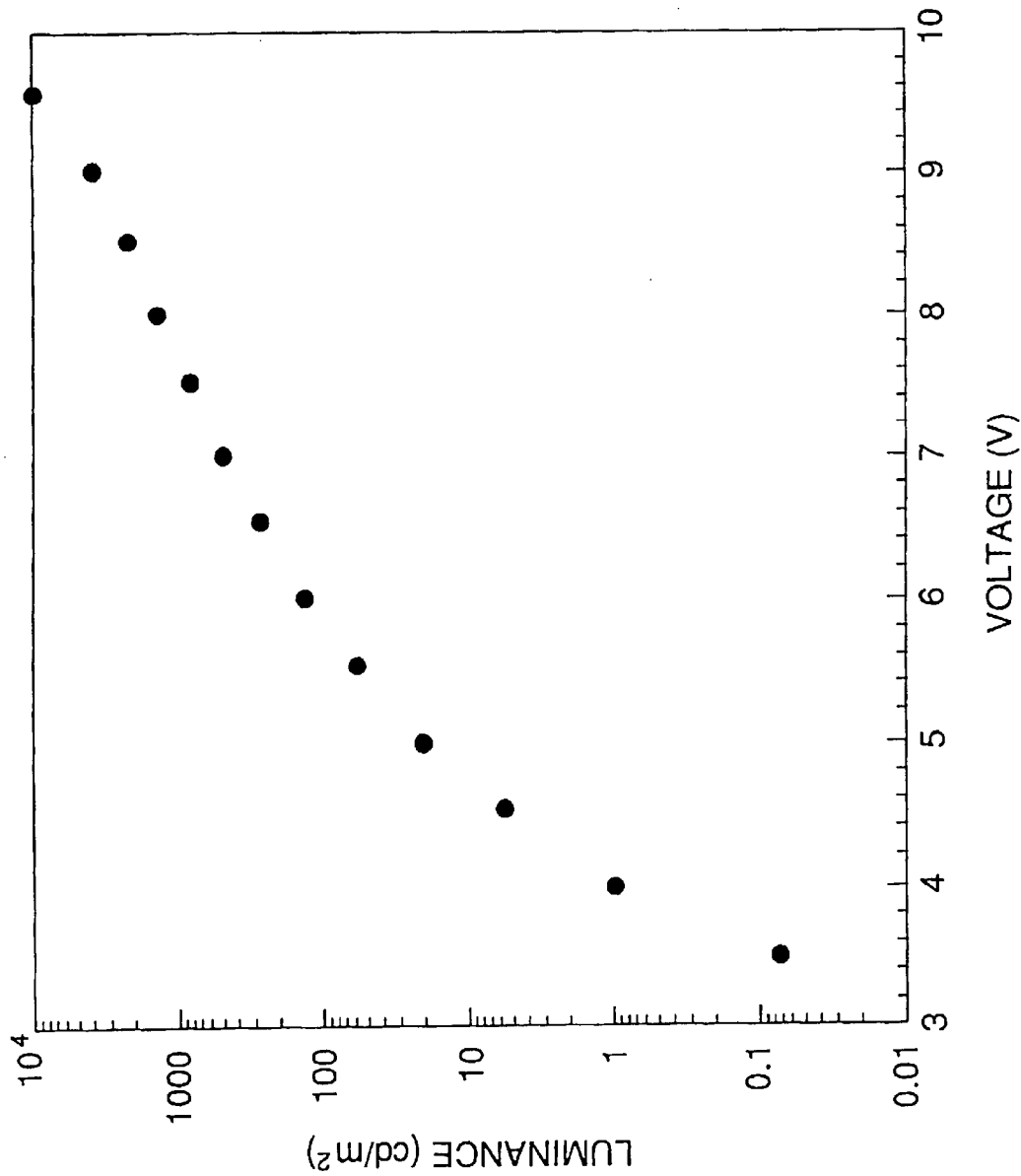
FIG. 27 is a graph showing the current-luminance characteristics of the organic EL device according to Example 4.

From the voltage-luminance characteristics shown in FIG. 27, it can be driven with a low voltage, and the luminance was good.

It is apparent from the above that in the organic EL devices of Examples 1 to 4 according to the invention, the hole transfer layer can serve as an emission layer due to sufficient electron-hole recombination in the hole transfer layer by providing the hole block layer 33 between the hole transfer emission layer 4a and/or 4b and the electron transfer layer 2, so as to obtain stable emission with high efficiency.

In addition to the blue emission in Examples 1 and 2, the green emission shown in Example 4, red emission by doping, and adjustment of chromaticity by doping were possible.

According to the examples described above, an organic EL device providing blue emission of good chromaticity with high luminance can be produced even by using the conventional materials, and possibilities and reduction in time of material development are possible. Further, it is considered that design concept in novel emission materials and electron transfer materials can be indicated.

EXAMPLE 5

The specific constitution of the organic EL device of this example is explained based on its production process.

On an ITO substrate comprising a glass substrate 6 of 30 mm×30 mm having provided thereon an ITO electrode 5 (film thickness: about 100 nm), $SiO_2$ 24 was vapor deposited to mask the other region than the emission region of 2 mm×2 mm, to produce an ITO substrate for producing an organic electroluminescence device.

As a hole transfer emission layer 4a, m-MTDATA (4,4', 4"-tris(3-methylphenylphenylamino)triphenylamine having the formula (12)) was vaopr deposited by a vacuum vapor deposition method under vacuum to a thickness of 30 nm at a vapor deposition rate of from 0.2 to 0.4 nm/sec.

α-NPD (α-naphtylphenyldiamine having the formula (13)) functioning as a hole transfer layer or a hole transfer emission layer 4b was vapor deposited by a vacuum vapor deposition method under vacuum to a thickness of 50 nm at a vapor deposition rate of from 0.2 to 0.4 nm/sec.

The mask was changed to a mask 22c having an opening 23c having an area of 1 mm×2 mm, which covered a half of the emission region of 2 mm×2 mm, bathocuproine (2,9-dimethyl-4,7-diphenyl-1,10-phenanthroline having the formula (3)) was vapor deposited at a vapor deposition rate of from 0.2 to 0.4 nm/sec as a hole block layer 33 at a thickness of 20 nm.

The mask was changed to 22a having an opening 23a of an area of 2 mm×2 mm, Alq$_3$ (8-hydorxy quinoline aluminum having the formula (18)) functioning as an electron transfer layer or an electron transfer emission layer 2 was vapor deposited at a thickness of 40 nm.

As a cathode 1, LiF was vapor deposited at a thickness of about 0.5 nm, followed by further vapor depositing Al at a thickness of about 200 nm, to produce an organic electroluminescence device 21 emitting blue light and green light shown in FIG. 15.

The characteristics were measured for the organic electroluminescence device emitting blue light and green light, and the results are shown below.

Figure 28:
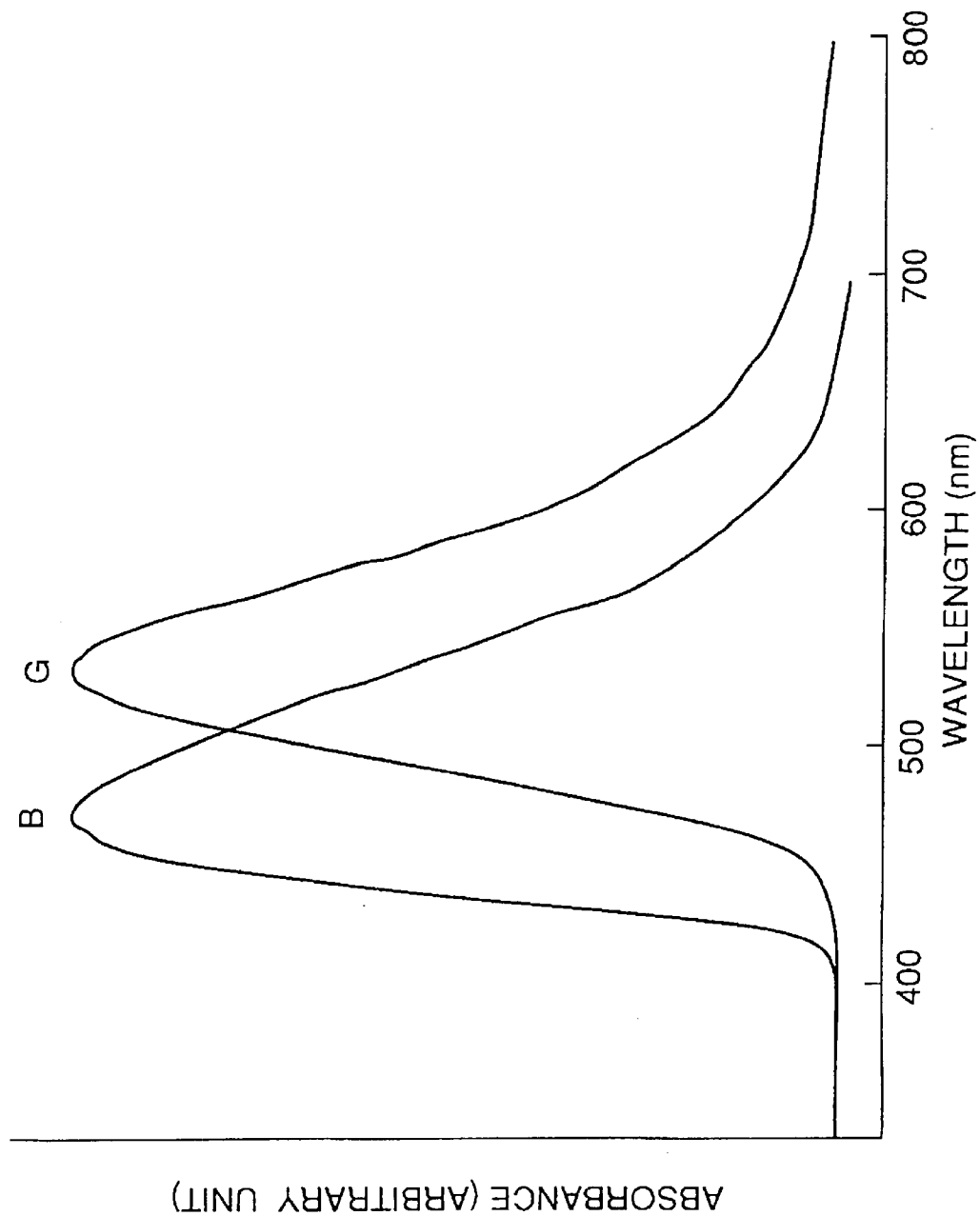
FIG. 28 is a graph showing the spectroscopic characteristics of the organic EL device according to Example 5.

FIG. 28 is a graph showing the spectral characteristics of the organic EL device 21 of Example 5. The maximum emission wavelength in the emission region containing bathocuproine functioning as a hole block layer was 460 nm, and the coordinates on the CIE chromaticity coordinates were (0.16, 0.14), which resulted in good blue emission. It was apparent from the shape of the emission spectrum that it was emission from α-NPD. From the emission parts in the absence of bathocuproine, emission from Alq$_3$ as the electron transfer emission material was obtained, from which good green emission having the maximum emission wavelength of 520 nm and CIE (0.33, 0.55) was obtained.

Figure 29:
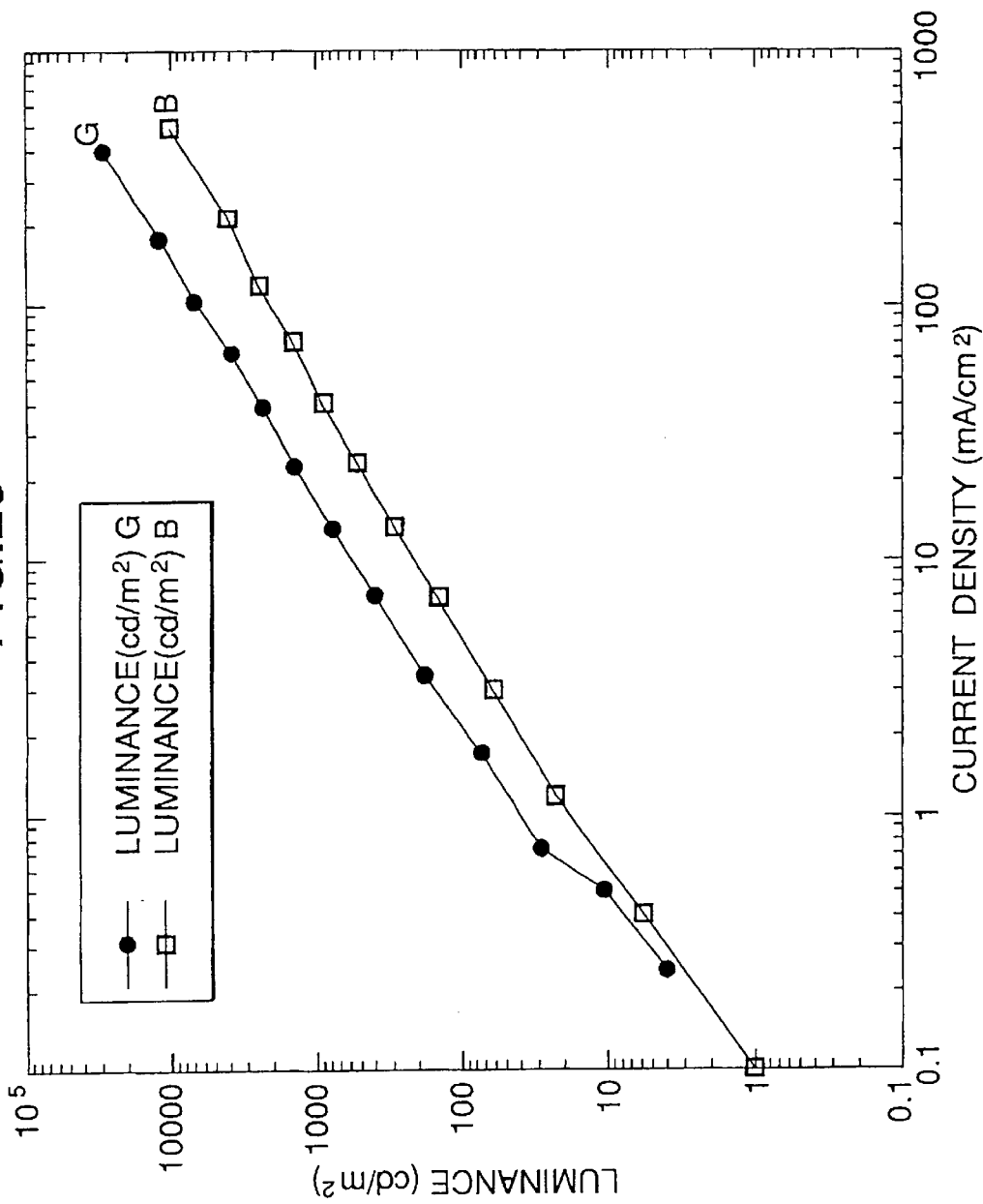
FIG. 29 is a graph showing the current-luminance characteristics of the organic EL device according to Example 5.

With respect to the luminance shown in FIG. 29, at a current density of 350 mA/cm$^2$, it was 6,000 cd/M$^2$ in the blue emission part, and 40,000 cd/M$^2$ in the green emission part.

When the organic EL device was pulse driven at a duty factor of 1/100, the peak luminance converted to the direct current driven was 55,000 cd/M$^2$ at a current density of 5,500 mA/cm$^2$, and a high luminance blue emission element having high performance sufficient to practical use could be produced.

The device emitting blue light and green light thus produced was a device having a blue emission region having an emission region of 1 mm×2 mm, which was emission from α-NPD, and a green emission region having an emission region of 1 mm×2 mm, which was emission from Alq$_3$, in the same emission region having an emission region of 2 mm×2 mm.

EXAMPLE 6

The specific constitution of the organic EL device of this example is explained based on its production process.

On an ITO substrate comprising a glass substrate 6 of 30 mm×30 mm having provided thereon an ITO electrode 5 (film thickness: about 100 nm), SiO$_2$ 24 was vapor deposited to mask the other region than the emission region of 2 mm×2 mm, to produce an ITO substrate for producing an organic electroluminescence device.

α-NPD (α-naphtylphenyldiamine having the formula (13)) functioning as a hole transfer layer or a hole transfer emission layer 4b was vapor deposited by a vacuum vapor deposition method under vacuum to a thickness of 50 nm (vapor deposition rate: from 0.2 to 0.4 nm/sec).

The mask was changed to a mask 22c having an opening 23c having an area of 1 mm×2 mm, which covered a half of the emission region of 2 mm×2 mm, bathocuproine (2,9-dimethyl-4,7-diphenyl-1,10-phenanthroline having the formula (3)) was vapor deposited as a hole block layer 33 at a thickness of 20 nm (vapor deposition rate: from 0.2 to 0.4 nm/sec).

The mask was changed to 22a having an opening 23a of an area of 2 mm×2 mm, Alq$_3$ (8-hydorxy quinoline aluminum having the formula (18)) functioning as an electron transfer layer or an electron transfer emission layer was vapor deposited at a thickness of 40 nm.

As a cathode 1, LiF was vapor deposited at a thickness of about 0.5 nm, followed by further vapor depositing Al at a thickness of about 200 nm, to produce an organic electroluminescence device 21 emitting blue light and green light.

The characteristics were measured for the thus produced organic electroluminescence device emitting blue light and green light, and the results are shown below.

As similar to the organic EL device 21 according to Example 1, the maximum emission wavelength in the emission region containing bathocuproine functioning as a hole block layer was 460 nm, and the coordinates on the CIE chromaticity coordinates were (0.155, 0.11), which resulted in good blue emission. It was apparent from the shape of the emission spectrum that it was emission from α-NPD. From the emission parts in the absence of bathocuproine, emission from Alq$_3$ as the electron transfer emission material was obtained, from which good green emission having the maximum emission wavelength of 520 nm and CIE (0.33, 0.55) was obtained.

With respect to the luminance, at a current density of 350 mA/cm$^2$, it was 1,500 cd/M$^2$.

The device emitting blue light and green light thus produced was a device having a blue emission region having an emission region of 1 mm×2 mm, which was emission from α-NPD, and a green emission region having an emission region of 1 mm×2 mm, which was emission from Alq$_3$, in the same emission region having an emission region of 2 mm×2 mm.

EXAMPLE 7

The specific constitution of the organic EL device of this example is explained based on its production process.

In order to produce a simple matrix of 8×9 (8 lines×9 columns) (G×2, B×1), 8 of ITO electrodes 5 at the line side having a thickness of about 100 nm with a width of 2.0 mm and a distance of 0.54 mm were formed on a glass substrate 6 of 30 mm×30 mm, and 10 of insulating layers 24 with a width of 1.0 mm and a distance of 1.54 mm were formed by vapor deposition of SiO$_2$ on the column side. The emission region of one EL cell thus produced was 1.54 mm×2.0 mm$^2$, and the opening ratio was 52.6%.

A mask 22a having an opening 23a of 19.78 mm×24.86 mm was used, an organic layer was first vapor deposited to cover the whole of the emission parts of the 8×9 (G×2, B×1) simple matrix.

As a hole transfer emission layer 4a, m-MTDATA (4,4'4"-tris(3-methylphenylphenylamino)triphenylamine having the formula (12)) was vapor deposited by a vacuum vapor deposition method under vacuum to a thickness of 30 nm at a vapor deposition rate of from 0.2 to 0.4 nm/sec, as a hole transfer layer or a hole transfer emission layer 4b, α-NPD (α-naphtylphenyldiamine having the formula (13)) was vapor deposited by a vacuum vapor deposition method under vacuum to a thickness of 50 nm (vapor deposition rate: from 0.2 to 0.4 nm/sec).

By changing the mask to 22b having three openings in the form of a stripe having an opening area of 2.1 mm×30 mm on the stripes of 2.0 mm×30 mm, which were the emission region of the ITO, bathocuproine (2,9-dimethyl-4,7-diphenyl-1,10-phenanthroline having the formula (3)) was vapor deposited on the transparent electrode 5 as a hole block layer 33 at a thickness of 20 nm at a vapor deposition rate of from 0.2 to 0.4 nm/sec.

The mask was changed to 22a having an opening 23a of an area of 19.78 mm×24.86 mm, $Alq_3$ (8-hydorxy quinoline aluminum having the formula (18)) functioning as an electron transfer layer or an electron transfer emission layer 2 was vapor deposited at a thickness of 40 nm.

The mask was changed to one having openings in the form of a stripe, LiF was vapor deposited as a cathode 1 at a thickness of about 0.5 nm for each of the stripes (three kinds of masks were used), followed by further vapor depositing Al at a thickness of about 200 nm, to produce an organic electroluminescence device 21 emitting blue light and green light shown in FIGS. 17A and 17B.

The organic electroluminescence device of a simple matrix thus produced exhibited substantially no leakage current and could be driven as a simple matrix since m-MTDATA and α-NPD were vapor deposited at a large opening area.

As a result of measurement of the characteristisc of the simple matrix, the maximum emission wavelength in the stripe containing bathocuproine functioning as a hole block layer was 460 nm, and the coordinates on the CIE chromaticity coordinates were (0.16, 0.14), which resulted in good blue emission. The luminance at a current density of 350 $mA/cm^2$ was 1,600 $cd/m^2$. It was apparent from the shape of the emission spectrum that it was emission from α-NPD. From the emission parts in the absence of bathocuproine, emission from $Alq_3$ as the electron transfer emission material was obtained, from which good green emission having the maximum emission wavelength of 520 nm and CIE (0.33, 0.55) was obtained.

In the invention, because the hole transfer layers and the electron transfer layers each comprise the common materials within each of the laminated bodies, in which the emission region is independently present in each of the hole transfer layer and the electron transfer layer, the laminated bodies for each of the colors of emission light can be easily produced with a simple process at a low cost. By forming the common layers on the whole surface of an organic pixel region by using a mask with a large opening, the film formation property and the step coverage property become good, and a leakage current between the cathode and the anode can be reduced.

Particularly, emission by the electron-hole recombination in the hole transfer organic material can be obtained (particularly, the structure in which the hole block layer is inserted between the hole transfer emission material and the electron transfer layer), and stable emission with high luminance and high efficiency can be obtained even in the organic electroluminescence device, the hole transfer layer of which is an emission layer, which has been considered as a difficult structure since there is no excellent non-emission electron transfer material. Particularly, it is conspicuous in blue emission, and a luminance of 10,000 $cd/m^2$ or more can be obtained by DC driven, or a peak luminance of 55,000 $cd/m^2$ in terms of direct current conversion can be obtained by pulse driven at a duty factor of 1/100.

What is claimed is:

1. An electroluminescence device comprising:
   at least three kinds of laminated bodies having a common hole transfer layer and a common electron transfer layer, each of the at least three kinds of laminated bodies having an emission region that is independently present in each of the common hole transfer layer and the common electron transfer layer, said emission region comprising an organic compound,
   said at least three kinds of laminated bodies each comprising an organic substance containing said emission region, and
   said at least three kinds of laminated bodies comprising:
      a blue-light emitting laminated body comprising a hole block layer for causing recombination of an electron and a hole in a hole transfer organic material of the common hole transfer layer of said blue-light emitting laminated body, wherein blue-light emission is obtained by said recombination, said blue-light emitting laminated body not comprising a red emission layer;
      a red-light emitting laminated body comprising a red-light emission layer for causing recombination of an electron and a hole in the red-light emission layer, wherein red-light emission is obtained by said recombination, said red-light emitting laminated body not comprising a hole block layer; and
      a green-light emitting laminated body wherein green emission is obtained by recombination of an electron and a hole in an electron transfer organic material of the common electron transfer layer of said green-light emitting laminated body, said green-light emitting laminated body not comprising a hole block layer or a red-light emission layer, and
      wherein said electroluminescence device emits at least three colors of light.

2. An electroluminescence device described in claim 1, wherein said hole block layer is provided between said hole transfer layer and said electron transfer layer.

3. An electroluminescence device described in claim 1, wherein a highest occupied molecular orbital level of said hole block layer is lower than the lower one in energy of highest occupied molecular orbital levels of organic layers laminated in contact with both sides of said hole block layer.

4. An electroluminescence device described in claim 1, wherein a lowest unoccupied molecular orbital level of said hole block layer is higher than the lower one in energy of lowest unoccupied molecular orbital levels of organic layers laminated in contact with both sides of said hole block layer, and is lower than the higher one in energy of them.

5. An electroluminescence device described in claim 1, wherein said emission region comprises a hole transfer material for emission of short wavelength light, and said hole block layer comprises a phenanthroline derivative.

6. An electroluminescence device described in claim 1, wherein said emission region comprises an organic compound, said electroluminescence device comprises at least three kinds of said laminated bodies each comprising an organic substance containing said emission region, and in at least one of said laminated bodies, red emission is obtained by recombination of an electron and a hole in an electron transfer organic material.

7. An electroluminescence device described in claim 1, wherein said electroluminescence device comprises an optically transparent substrate having thereon, in this order, a transparent electrode, an organic layer and a metallic electrode.

8. An electroluminescence device described in claim 7, wherein said electroluminescence device comprises an organic electroluminescence device, in which said transparent electrode, said organic layer and said metallic electrode form a matrix pattern on said same substrate.

9. An electroluminescence device described in claim 8, wherein said electroluminescence device comprises a device for a color display.

10. A process for producing an electroluminescence device comprising at least three kinds of laminated bodies having a common hole transfer layer and a common electron transfer layer, each of the at least three kinds of laminated bodies having an emission region that is independently present in each of the common hole transfer layer and the common electron transfer layer, and said electroluminescence device emitting at least three colors of light, said process comprising:
forming a first electrode, which is common in at least three kinds of said laminated bodies, on a common substrate,
forming said common hole transfer layer by film formation of a common hole transfer layer forming material on a region containing at least three kinds of said laminated bodies on said first electrode,
forming said common electron transfer layer by film formation of a common electron transfer layer forming material on a region containing at least three kinds of said laminated bodies on a region containing said common hole transfer layer,
forming second electrodes for at least three kinds of said laminated bodies on said common electron transfer layer, to face said first electrode,
in a blue-light emitting laminated body, forming a hole block layer for causing recombination of an electron and a hole in a hole transfer organic material of the common hole transfer layer of the blue-light emitting laminated body, wherein blue-light emission is obtained by said recombination, and
in a red-light emitting laminated body, forming a red-light emitting layer for causing recombination of an electron and a hole in the red-light emission layer, wherein red-light emission is obtained by said recombination.

11. A process for producing an electroluminescence device as described in claim 10, wherein said emission region is formed from an organic compound, at least three kinds of said laminated bodies each comprising an organic substance containing said emission region is formed, and in at least one of said laminated bodies, green emission is obtained by recombination of an electron and a hole in an electron transfer organic material.

12. A process for producing an electroluminescence device as described in claim 10, wherein said emission region is formed from an organic compound, at least three kinds of said laminated bodies each comprising an organic substance containing said emission region is formed, and in at least one of said laminated bodies, red emission is obtained by recombination of an electron and a hole in an electron transfer organic material.

13. A process for producing an electroluminescence device as described in claim 10, wherein said emission region is formed from an organic compound, at least three kinds of said laminated bodies each comprising an organic substance containing said emission region is formed, and in at least one of said laminated bodies, blue emission is obtained by recombination of an electron and a hole in a hole transfer organic material.

14. A process for producing an electroluminescence device as described in claim 13, wherein a hole block layer for causing said recombination in said hole transfer layer is formed.

15. A process for producing an electroluminescence device as described in claim 14, wherein said hole block layer is provided between said hole transfer layer and said electron transfer layer.

16. A process for producing an electroluminescence device as described in claim 14, wherein a highest occupied molecular orbital level of said hole block layer is lower than the lower one in energy of highest occupied molecular orbital levels of organic layers laminated in contact with both sides of said hole block layer.

17. A process for producing an electroluminescence device as described in claim 14, wherein a lowest unoccupied molecular orbital level of said hole block layer is higher than the lower one in energy of lowest unoccupied molecular orbital levels of organic layers laminated in contact with both sides of said hole block layer, and is lower than the higher one in energy of them.

18. A process for producing an electroluminescence device as described in claim 14, wherein said emission region is formed from a hole transfer material for emission of short wavelength light, and said hole block layer is formed from a phenanthroline derivative.

19. A process for producing an electroluminescence device as described in claim 14, wherein a transparent electrode, an organic layer and a metallic electrode are formed, in this order, on an optically transparent substrate.

20. A process for producing an electroluminescence device described in claim 19, wherein said electroluminescence device comprising an organic electroluminescence device, in which said transparent electrode, said organic layer and said metallic electrode form a matrix pattern on said same substrate, is produced.

21. A process for producing an electroluminescence device as described in claim 20, wherein a device for a color display is produced.

22. An electroluminescence device comprising:
two kinds of laminated bodies having a common hole transfer layer and a common electron transfer layer, each of the two kinds of laminated bodies having an emission region that is independently present in each of the common hole transfer layer and the common electron transfer layer, said emission region comprising an organic compound,
said two kinds of laminated bodies each comprising an organic substance containing said emission region, and
said two kinds of laminated bodies comprising:
a blue-light emitting laminated body comprising a hole block layer for causing recombination of an electron and a hole in a hole transfer organic material of the common hole transfer layer of said blue-light emitting laminated body, wherein blue-light emission is obtained by said recombination, said blue-light emitting laminated body not comprising a red emission layer; and
a green-light emitting laminated body wherein green emission is obtained by recombination of an electron and a hole in an electron transfer organic material of the common electron transfer layer of said green-light emitting laminated body, said green-light emitting laminated body not comprising a hole block layer or a red emission layer, and
wherein said electroluminescence device emits two colors of light.

23. An electroluminescence device described in claim 22, wherein said hole block layer is provided between said hole transfer layer and said electron transfer layer.

24. An electroluminescence device described in claim 22, wherein a highest occupied molecular orbital level of said hole block layer is lower than the lower one in energy of highest occupied molecular orbital levels of organic layers laminated in contact with both sides of said hole block layer.

25. An electroluminescence device described in claim 22, wherein a lowest unoccupied molecular orbital level of said hole block layer is higher than the lower one in energy of lowest unoccupied molecular orbital levels of organic layers laminated in contact with both sides of said hole block layer, and is lower than the higher one in energy of them.

26. An electroluminescence device described in claim 22, wherein said emission region comprises a hole transfer material for emission of short wavelength light, and said hole block layer comprises a phenanthroline derivative.

27. An electroluminescence device described in claim 22, wherein said electroluminescence device comprises an optically transparent substrate having thereon, in this order, a transparent electrode, an organic layer and a metallic electrode.

28. An electroluminescence device described in claim 27, wherein said electroluminescence device comprises an organic electroluminescence device, in which said transparent electrode, said organic layer and said metallic electrode form a matrix pattern on said same substrate.

29. An electroluminescence device described in claim 28, wherein said electroluminescence device comprises a device for a color display.

30. A process for producing an electroluminescence device comprising two kinds of laminated bodies having a common hole transfer layer and a common electron transfer layer, each of the two kinds of laminated bodies having an emission region that is independently present in each of the common hole transfer layer and the common electron transfer layer, and said electroluminescence device emitting two colors of light, said process comprising:
forming a first electrode, which is common in two kinds of said laminated bodies, a blue-light emitting laminated body and a green-light emitting laminated body, on a common substrate,
forming said common hole transfer layer by film formation of a common hole transfer layer forming material on a region containing two kinds of said laminated bodies on said first electrode,
forming said common electron transfer layer by film formation of a common electron transfer layer forming material on a region containing two kinds of said laminated bodies on a region containing said common hole transfer layer, and
forming second electrodes for two kinds of said laminated bodies on said common electron transfer layer, to face said first electrode,
in said blue-light emitting laminated body, forming a hole block layer for causing recombination of an electron and a hole in a hole transfer organic material of the common hole transfer layer of the blue-light emitting laminated body, wherein blue-light emission is obtained by said recombination, said green-light emitting laminated body not comprising a hole block layer.

31. A process for producing an electroluminescence device as described in claim 30, wherein said emission region is formed from an organic compound, two kinds of said laminated bodies each comprising an organic substance containing said emission region is formed, and in one of said laminated bodies, blue emission is obtained by recombination of an electron and a hole in a hole transfer organic material.

32. A process for producing an electroluminescence device as described in claim 31, wherein a hole block layer for causing said recombination in said hole transfer layer is formed.

33. A process for producing an electroluminescence device as described in claim 32, wherein said hole block layer is provided between said hole transfer layer and said electron transfer layer.

34. A process for producing an electroluminescence device as described in claim 33, wherein a highest occupied molecular orbital level of said hole block layer is lower than the lower one in energy of highest occupied molecular orbital levels of organic layers laminated in contact with both sides of said hole block layer.

35. A process for producing an electroluminescence device as described in claim 33, wherein a lowest unoccupied molecular orbital level of said hole block layer is higher than the lower one in energy of lowest unoccupied molecular orbital levels of organic layers laminated in contact with both sides of said hole block layer, and is lower than the higher one in energy of them.

36. A process for producing an electroluminescence device as described in claim 31, wherein said emission region is formed from a hole transfer material for emission of short wavelength light, and said hole block layer is formed from a phenanthroline derivative.

37. A process for producing an electroluminescence device as described in claim 30, wherein said emission region is formed from an organic compound, two kinds of said laminated bodies each comprising an organic substance containing said emission region is formed, and in one of said laminated bodies, green emission is obtained by recombination of an electron and a hole in a hole transfer organic material.

38. A process for producing an electroluminescence device as described in claim 36, wherein a transparent electrode, an organic layer and a metallic electrode are formed, in this order, on an optically transparent substrate.

39. A process for producing an electroluminescence device as described in claim 38, wherein said electroluminescence device comprising an organic electroluminescence device, in which said transparent electrode, said organic layer and said metallic electrode form a matrix pattern on said same substrate, is produced.

40. A process for producing an electroluminescence device as described in claim 39, wherein a device for a color display is produced.

* * * * *